United States Patent
Lee et al.

(10) Patent No.: US 7,211,898 B2
(45) Date of Patent: May 1, 2007

(54) THIN FILM TRANSISTOR SUBSTRATE AND METHOD FOR FORMING METAL WIRE THEREOF

(75) Inventors: Jae-Gab Lee, Seoul (KR); Chang-Oh Jeong, Suwon (KR); Myung-Mo Sung, Goyang (KR); Hee-Jung Yang, Namyangju (KR); Beom-Seok Cho, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 10/539,223

(22) PCT Filed: Mar. 26, 2003

(86) PCT No.: PCT/KR03/00599

§ 371 (c)(1),
(2), (4) Date: Feb. 1, 2006

(87) PCT Pub. No.: WO2004/061991

PCT Pub. Date: Jul. 22, 2004

(65) Prior Publication Data

US 2006/0163582 A1 Jul. 27, 2006

(30) Foreign Application Priority Data

Jan. 7, 2003 (KR) .................. 10-2003-0000757

(51) Int. Cl.
*H01L 23/48* (2006.01)
(52) U.S. Cl. ..................... 257/759; 257/762
(58) Field of Classification Search ............... 257/40, 257/762, 759, 752, 753
See application file for complete search history.

(56) References Cited

U.S. PATENT DOCUMENTS

| 6,323,131 | B1 * | 11/2001 | Obeng et al. ............... 438/687 |
| 6,335,539 | B1 * | 1/2002 | Dimitrakopoulos et al. .. 257/40 |
| 6,569,707 | B2 * | 5/2003 | Dimitrakopoulos et al. .. 438/99 |
| 6,776,864 | B2 * | 8/2004 | Hahn et al. ................. 156/230 |
| 6,798,464 | B2 * | 9/2004 | Bietsch et al. ................ 349/12 |

(Continued)

FOREIGN PATENT DOCUMENTS

WO   WO 01/00538 A2   1/2001

OTHER PUBLICATIONS

Collet, J. et al., "Performances of sexithiophene based thin-film transistor using self-assembled monolayers," Materials Research Sociaty Symposium Proceedings (1998). 488 (Electrical, Optical, and Magnetic Properties of Organic Solid-State Materials IV), 407-412.*

(Continued)

*Primary Examiner*—Sara Crane
(74) *Attorney, Agent, or Firm*—Edward C. Kwok; MacPherson Kwok Chen & Heid LLP

(57) ABSTRACT

The present invention relates to a thin film transistor substrate and a metal wiring method thereof, more particularly to a thin film transistor substrate comprising self-assembled monolayers between the substrate and the metal wiring, and a metal wiring method thereof. Since a thin film transistor substrate of the present invention comprises three-dimensionally cross-linked self-assembled monolayers between the Si surface and the metal wiring, it has good adhesion ability and anti-diffusion ability.

12 Claims, 38 Drawing Sheets

U.S. PATENT DOCUMENTS

| | | | |
|---|---|---|---|
| 6,903,207 B2* | 6/2005 | Mirkin et al. | 536/25.3 |
| 2002/0045289 A1 | 4/2002 | Dimitrakopoulos et al. | |
| 2002/0084252 A1 | 7/2002 | Buchwalter et al. | |
| 2006/0286726 A1* | 12/2006 | Sirringhaus et al. | 438/151 |

OTHER PUBLICATIONS

Patent Abstracts of Japan, Publication No. 2000-330134, Nov. 30, 2000.

* cited by examiner

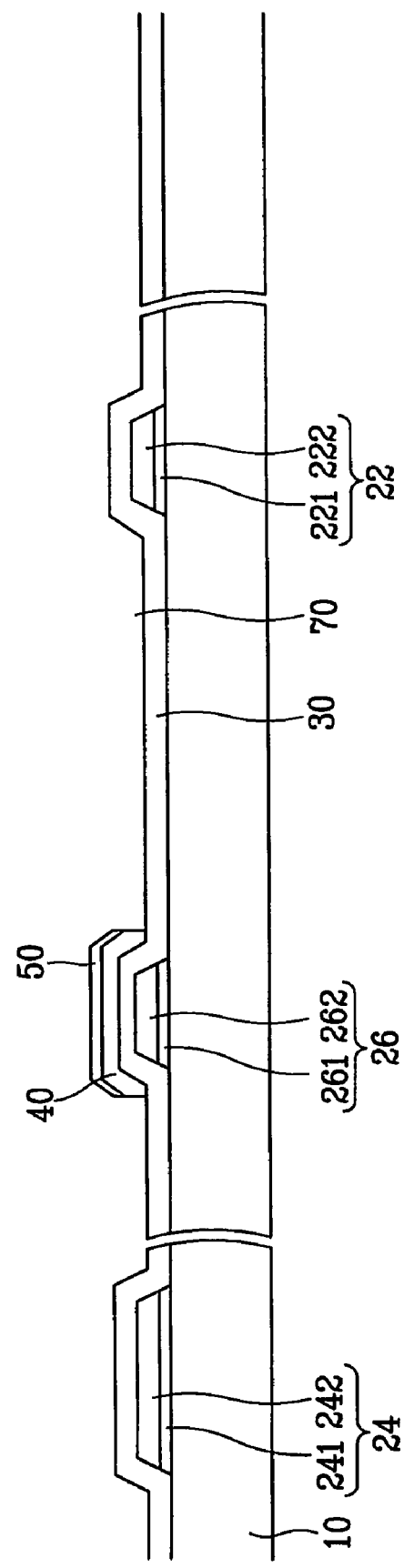

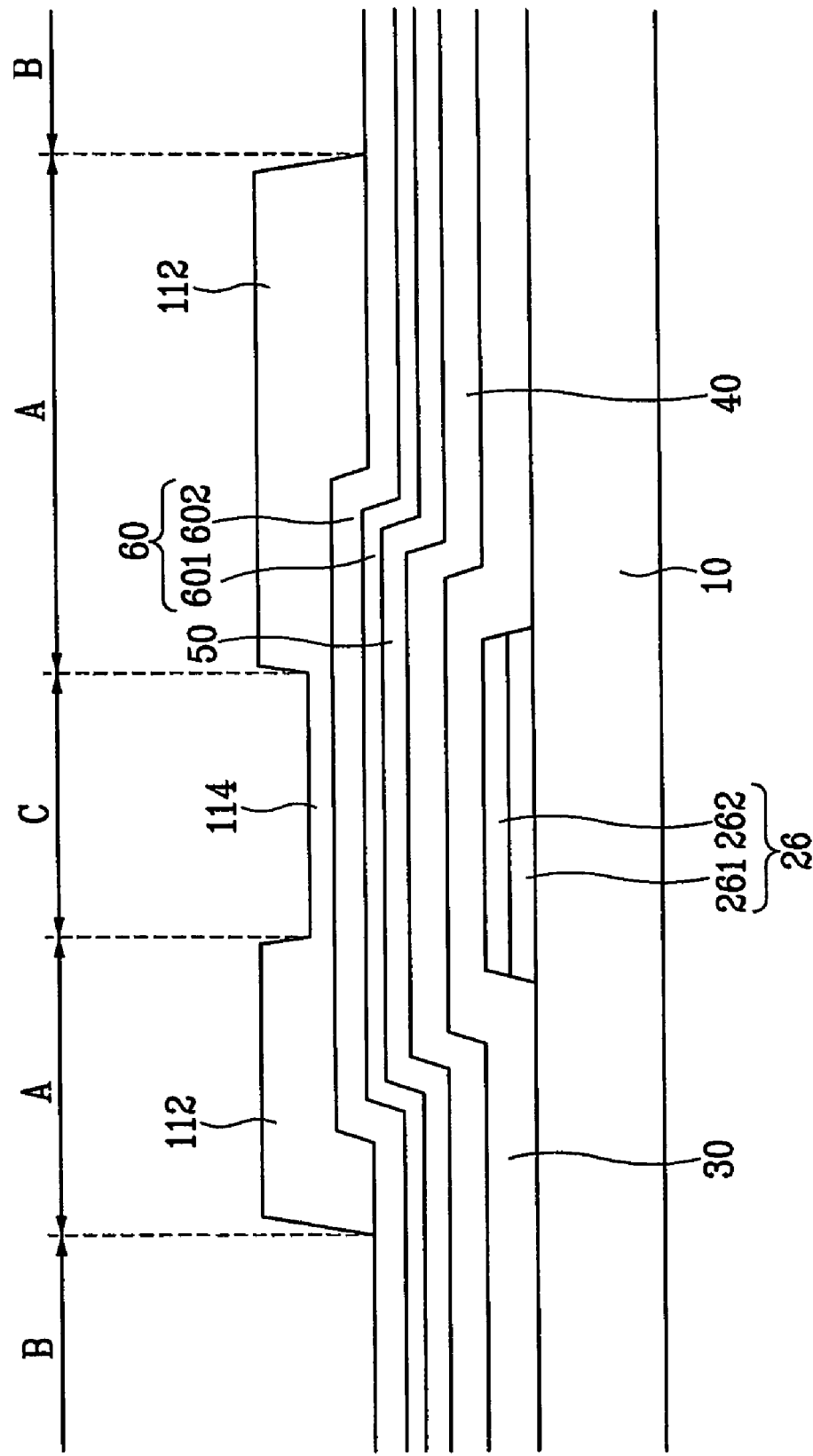

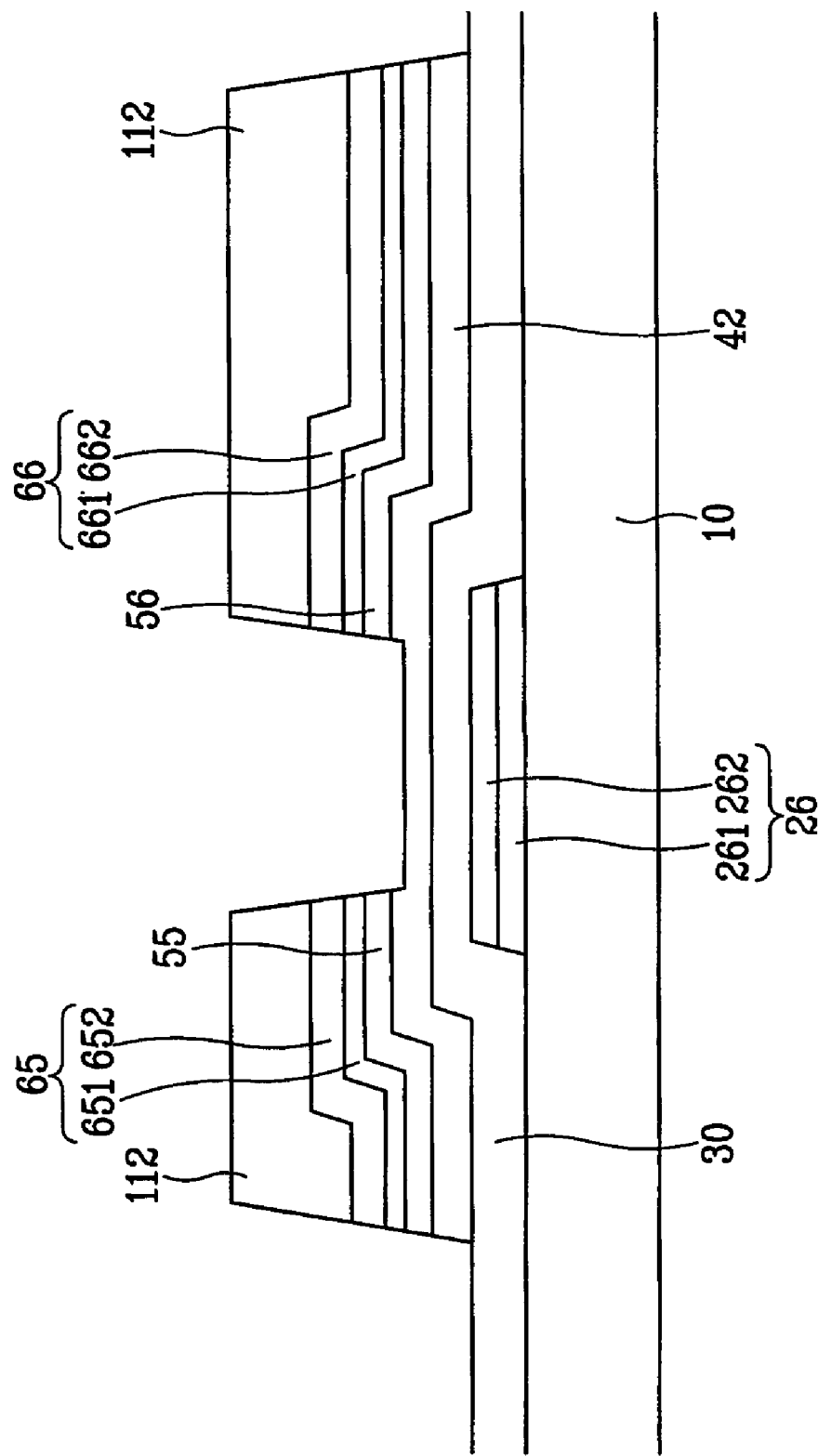

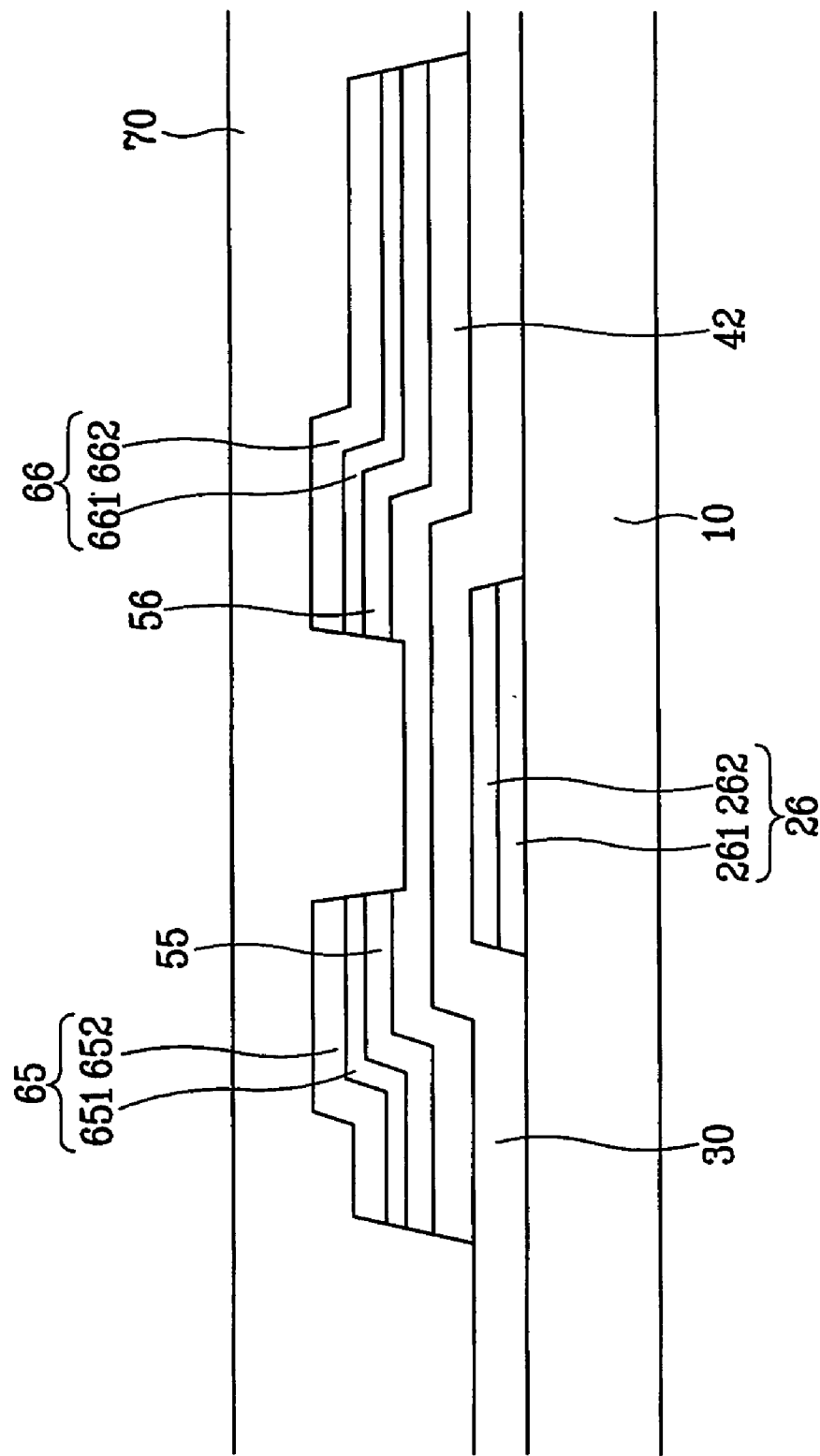

THIN FILM TRANSISTOR SUBSTRATE AND METHOD FOR FORMING METAL WIRE THEREOF

BACKGROUND OF THE INVENTION (a) Field of the Invention

The present invention relates to a thin film transistor substrate and a metal wiring method thereof, and more particularly to a thin film transistor substrate having superior adhesion ability and diffusion resistance and a metal wiring method thereof.

(b) Description of the Related Art

A thin film transistor (TFT) is one of the devices widely used as switching devices of TFT liquid crystal displays.

A thin film transistor substrate comprises a scanning signal wiring or gate wiring that transfers scanning signals, a picture signal wiring or data wiring that transfers picture signals, a thin film transistor that connects the gate wiring and the data wiring, a pixel electrode connected to the thin film transistor, a gate insulation film that covers the gate wiring, and a passivation film that protects the thin film transistor and the data wiring. A thin film transistor comprises a semiconductor layer that forms a gate electrode and channels, a source electrode, a drain electrode, a gate insulation film and a passivation layer. A thin film transistor is a switching device that transfers or interrupts picture signals transferred through the data wiring depending on scanning signals transferred by the gate wiring.

In TFT LCDs using the thin film transistor as a switching device, an electric field is applied to the liquid crystal using optical anisotropy and polarization of the liquid crystal. The electric field controls arrangement orientation of the liquid crystal molecules to offer images.

In the active matrix liquid crystal display (AMLCD), which is being actively researched and developed, the pixel electrodes connected with the thin film transistor are arranged in matrix form, so that it can offer large screen size and high resolution, such as SXGA or UXGA.

In order to make such large-area and high-resolution liquid crystal displays as SXGA or UXGA, resistance of gate wiring, data wiring and other wirings should be low. In particular, if the resistance of the gate wiring is high, the image quality worsens because of cross-talks due to signal delay caused by the wiring resistance. Metals that can be used for the wiring and their characteristics are summarized in the following Table 1.

TABLE 1

| Metal | Specific resistance ($\mu\Omega \cdot cm$) | Price | Adhesion ability | Heat resistance |
|---|---|---|---|---|
| Cu | 2 | Low | Low | High |
| Au | 3 | High | Low | High |
| Al | 4 | Low | High | Low |
| Mo | 20 | Moderate | High | High |
| Cr | 50 | Moderate | High | High |

As seen in Table 1, aluminum has low heat resistance. While copper is satisfactory in cost and heat resistance, it has poor adhesion ability to the substrate. Therefore, many researches are trying to improve the adhesion ability of copper to the substrate.

In this regard, wirings of copper alloys, such as Cu/Ti/Si, Cu/TiN/Si, Cu/Ta/Si and Cu/TaN/Si, are widely used. However, these copper alloy wirings are manufactured through complicated processes. Also, they have weak adhesion of Si and Cu, and the anti-diffusion films are thick. Moreover, the anti-diffusion films react with Cu during heat treatment.

Recently, the copper-silver alloy wirings are widely used. However, silver has weak adhesion ability to the glass substrate or silicon layers. The weak adhesion ability causes problems like the thin film's coming off from the substrate or breaking of the wiring. Also, silver is easily damaged by dry-type etching agents for etching insulation film consisting of silicon nitride, etc.

SUMMARY OF THE INVENTION

The present invention relates to a thin film transistor substrate and a metal wiring method thereof, more particularly to a thin film transistor substrate comprising self-assembled monolayers between the substrate and metal wiring and a metal wiring method thereof.

The thin film transistor substrate of the present invention has cross-linked self-assembled monolayers between Si surface and metal wiring, thereby offering good adhesion ability and anti-diffusion ability.

BRIEF DESCRIPTION OF THE DRAWINGS

FIG. 6b is a cross-sectional view along the line VIb–VIb' of FIG. 6a.

FIG. 7b is a cross-sectional view along the line VIIb–VIIb' of FIG. 7a and shows the step next to that of FIG. 6b.

FIGS. 15*b* and 15*c* are cross-sectional views along the lines XVb–XVb' and XVc–XVc' of FIG. 15*a*.

FIGS. 16*a*, 17*a* and 18*a* and FIGS. 16*b*, 17*b* and 18*b* are cross-sectional views along the lines XVb–XVb' and XVc–XVc' of FIG. 15*a*, respectively, and show the steps following that of FIGS. 15*b* and 15*c*.

FIG. 19*a* and FIG. 19*b* are cross-sectional views of a thin film transistor substrate at the step next to that of FIGS. 18*a* and 18*b*.

DETAILED DESCRITPION OF THE PREFERRED EMBODIMENTS

Figure 1A:
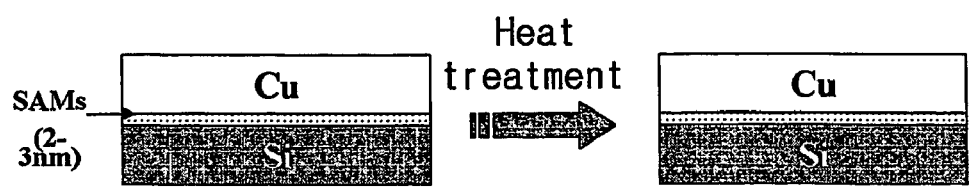
FIGS. 1a and 1b show copper or copper alloy wiring structure, wherein an anti-diffusion film is formed between the Si surface and Cu.

An object of the present invention is to provide a thin film transistor substrate having superior adhesion ability to the substrate and superior anti-diffusion ability.

It is another object of the present invention to provide a liquid crystal display comprising the thin film transistor substrate.

It is still another object of the present invention to provide a metal wiring method of the thin film transistor substrate.

In order to achieve these objects, the present invention provides a thin film transistor substrate characterized by comprising self-assembled monolayers between the substrate and metal wiring.

The present invention also provides a liquid crystal display comprising the thin film transistor substrate.

The present invention also provides a metal wiring method of a thin film transistor substrate, which comprises: (a) a step of forming self-assembled monolayers by coating self-assembled monolayers (SAMs) forming coating composition on the substrate and heat-treating it; (b) a step of depositing metal wiring material on the substrate; and (c) a step of heat-treating the substrate.

Hereunder is given a more detailed description of the present invention

A thin film transistor substrate of the present invention is characterized by self-assembled monolayers formed between the substrate and metal wiring.

For self-assembled monolayers forming materials, 3-aminopropyltrimethoxysilane, 3-aminopropyltriethoxysilane, 2-aminoundecyltrimethoxysilane, aminophenyltrimethoxysilane, N-(2-aminoethylaminopropyl)trimethoxysilane, methyltrimethoxysilane, propyltriacetoxysilane and (3-mercaptopropyl)trimethoxysilane are preferable.

Since self-assembled monolayers formed from these silane compounds have three-dimensional cross-linkages, they offer good adhesion ability to the substrate. Also they prevent diffusion of copper to the substrate surface. Therefore, they are useful in preparing high-quality substrates.

In order to prepare a thin film transistor substrate, the self-assembled monolayers are preferred to have 2 to 3 nm of thickness.

A metal wiring is formed on the self-assembled monolayers. For the metal wiring material, copper or copper alloy is preferred. For the metal used in the copper alloy, Ag, Mg, B, Ca, Al, Li, Np, Pu, Ce, Eu, Pr, La, Nd, Sm, Zn or any mixture thereof are preferred.

When a copper alloy is used for the metal wiring material the metal component, i.e., Ag, Mg, B, Ca, Al, Li, Np, Pu, Ce, Eu, Pr, La, Nd, Sm, Zn or any mixture thereof, diffused to the substrate or film surface serves as an anti-diffusion film together with the self-assembled monolayers. Since these metals have lower surface energy than copper, they have desirable contact resistance. Particularly, Ag offers superior anti-diffusion ability because it is not fairly soluble to Si.

In a thin film transistor substrate comprising self-assembled monolayers between the substrate and metal wiring according to the present invention, the substrate is preferably a glass substrate, an n+a-Si/a-Si/SiN three-layer substrate, or an Si, $SiO_2$ or other low-k (k<3.5) substrate.

When self-assembled monolayers are formed in a glass substrate, an n+a-Si/a-Si/SiN three-layer substrate, or an Si, $SiO_2$ or other low-k (k<3.5) substrate, which is used for a thin film transistor substrate of the present invention, a silicide is formed to offer superior adhesion to the lower substrate and prevents diffusion of copper to the substrate.

A metal wiring method of a thin film transistor substrate of the present invention is as follows.

Firstly, self-assembled monolayers (SAMs) forming coating composition is coated on the substrate and heat-treated to form self-assembled monolayers (SAMs) [Step (a)].

For the self-assembled monolayers forming material, 3-aminopropyltrimethoxysilane, 3-aminopropyltriethoxysilane, 2-aminoundecyltrimethoxysilane, aminophenyltrimethoxysilane, N-(2-aminoethylaminopropyl)trimethoxysilane, methyltrimethoxysilane, propyltriacetoxysilane and (3-mercaptopropyl)trimethoxysilane are preferable.

To form self-assembled monolayers on the substrate, the self-assembled monolayers forming material should be dissolved in a solvent, coated on the substrate and hardened by heat treatment. For the solvent, alcohols like methanol, ethanol, propanol and butanol, cellusolv solvents like methyl cellusolv, dimethylformamide or water are preferred.

Mixing ration of the silane compound, a self-assembled monolayers forming material, and the solvent is preferably 1:20 to 1:30 by weight.

The self-assembled monolayers forming material can be coated on the substrate by dipping, spinning, spraying or printing.

After the substrate self-assembled monolayers forming material dissolved in the solvent is coated on the substrate, it is heat-treated and hardened to form self-assembled monolayers. The heat treatment temperature is preferably 100 to 300° C., so that the silane compound can be condensed.

In a thin film transistor substrate having self-assembled monolayers according to the present invention, a glass substrate, an n+a-Si/a-Si/SiN three-layer substrate, or an Si, $SiO_2$ or other low-k (k<3.5) substrate can be preferably used for the substrate.

After self-assembled monolayers are formed on the substrate, a metal wiring material is deposited on it [Step (b)]. For the metal wiring material, copper or copper alloy is preferable. For the alloy component, a metal having lower surface energy than copper, such as Ag, Mg, B, Ca, Al, Li, Np, Pu, Ce, Eu, Pr, La, Nd, Sm, Zn or any mixture thereof, is preferable. In the copper alloy, the alloy component is preferably added in 0.1 to 15 wt % to copper.

Then, the substrate with the metal wiring material deposited is heat-treated [Step ⓒ]. The heat treatment is preferably carried out at 100 to 300° C. in vacuum.

If Ti, TiN, Ta or TaN, which is used as conventional anti-diffusion film, is heat-treated, copper reacts with the anti-diffusion film to increase specific resistance. However, the self-assembled monolayers of the present invention do not react with copper when heat-treated. Therefore, the specific resistance does not increase and a thin anti-diffusion film of nanometer dimension is obtained.

Figure 1B:

FIGS. 1a and 1b show a copper or copper alloy wiring structure, wherein self-assembled monolayers are formed between Si surface and Cu. In FIG. 1a, only copper was used; and in FIG. 1b, copper-silver alloy was used. As seen in FIG. 1b, the copper-silver alloy offers an Ag layer on the self-assembled monolayers to form a three-layer structure. Therefore, diffusion of copper to the Si surface can be prevented more effectively.

Figure 2A:
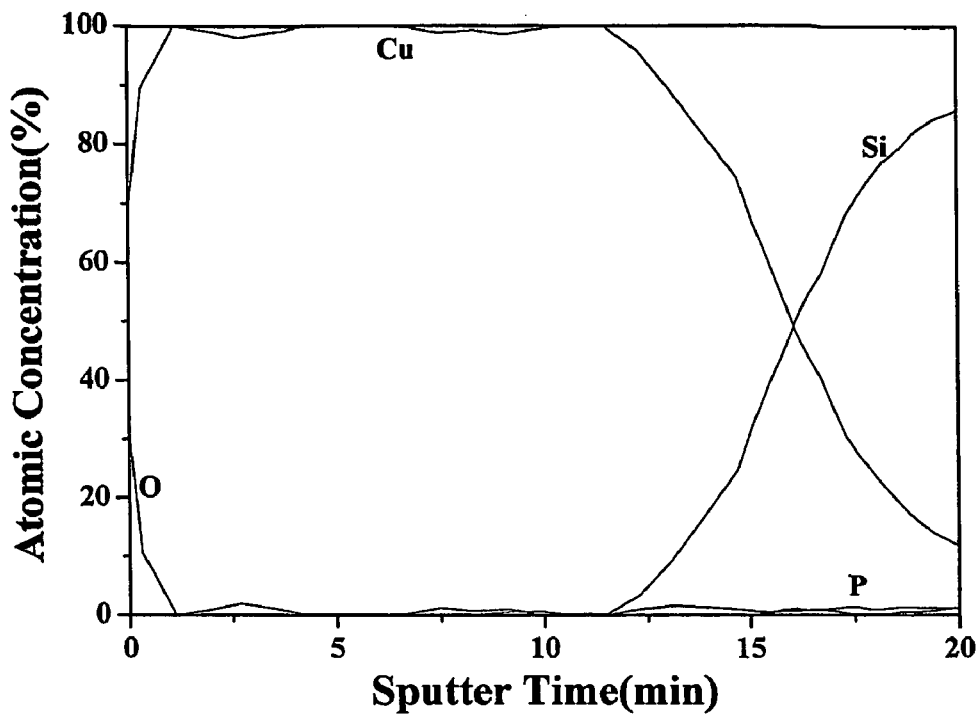
FIGS. 2a to 2d show AES (Auger electron spectrometer) depth profiles of copper (Cu) wiring, wherein self-assembled monolayers are formed between the Si surface and Cu or Cu(Ag), before and after heat treatment at 300° C.
Figure 2B:
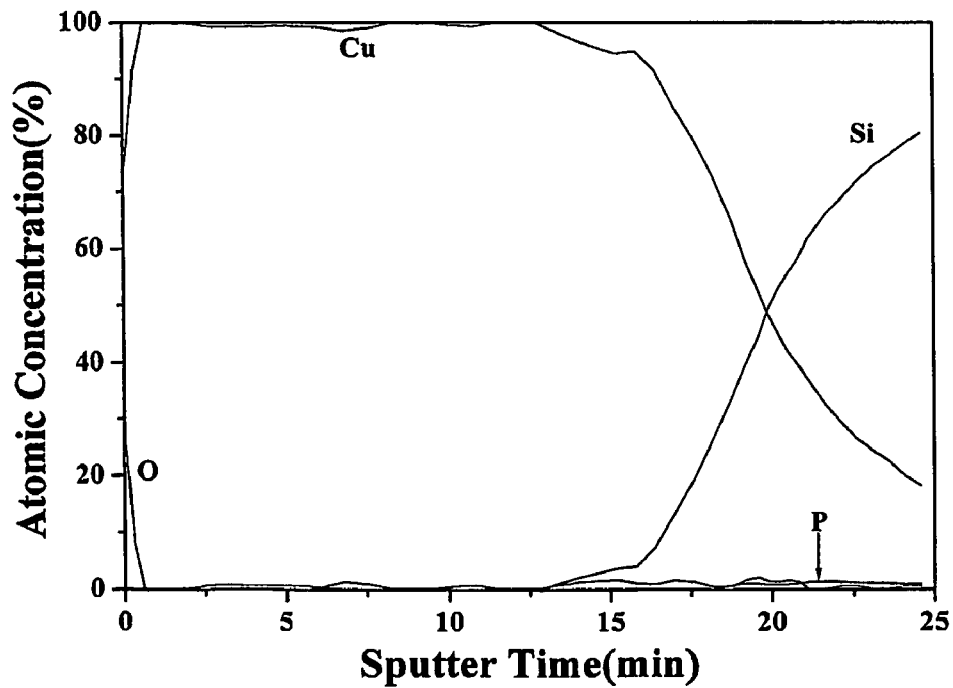
Figure 2C:
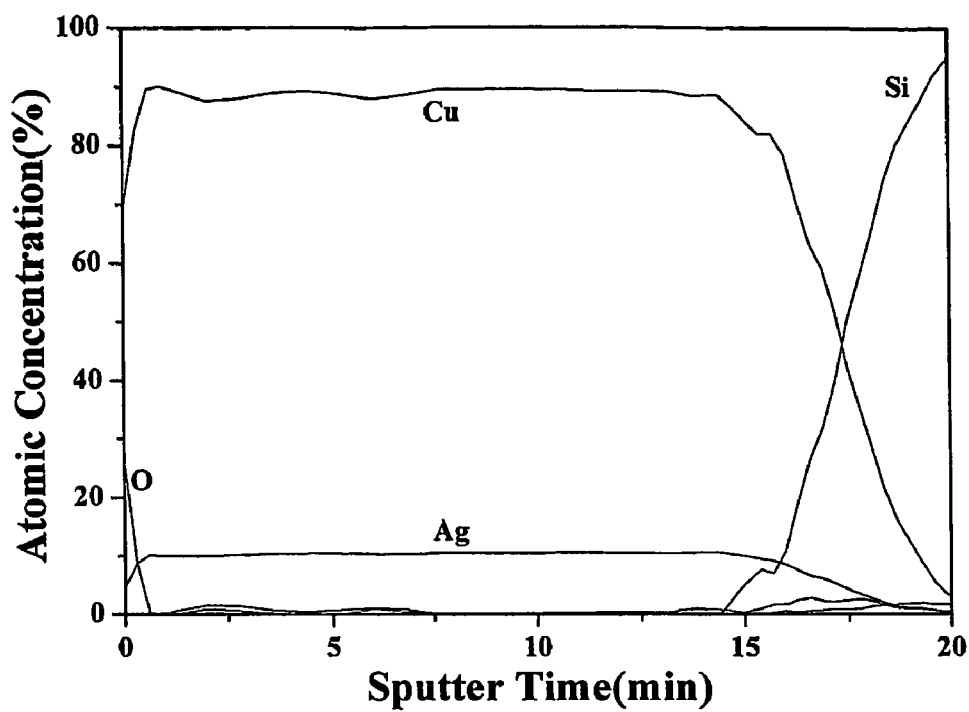
Figure 2D:
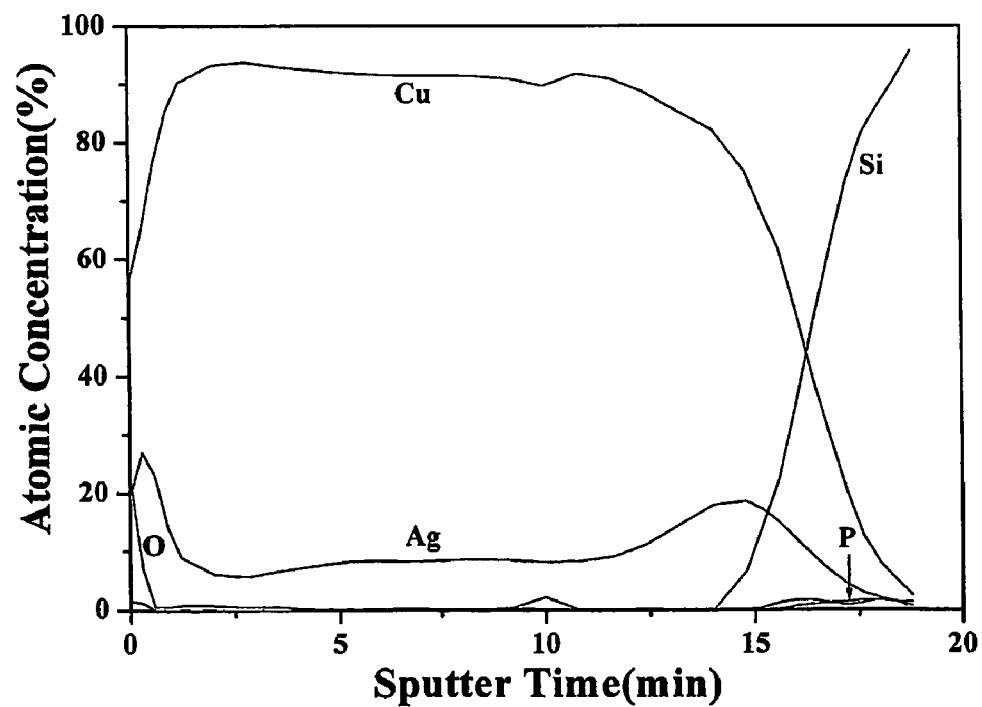

FIGS. 2a and 2b are AES depth profiles of a copper (Cu) wiring, wherein self-assembled monolayers are formed between the Si surface and Cu, before and after heat treatment at 300° C. FIGS. 2c and 2d are AES depth profiles of a copper alloy [Cu(Ag)] wiring, wherein self-assembled monolayers are formed between the Si surface and Cu, before and after heat treatment at 300° C. AES (Auger electron spectrometer) analysis is a method of detecting substances in a specimen by sputtering electrons to the specimen.

As seen in FIG. 2a to FIG. 2d, Cu was hardly detected after 15 seconds of sputtering. It shows that the self-assembled monolayers formed between the Si surface and copper or copper alloy effectively prevents diffusion of Cu to the Si surface. Therefore, they can be utilized to make a thin film transistor substrate having a superior anti-diffusion ability. In particular, a superior anti-diffusion ability can be maintained even at about 400° C. if a copper alloy is used as wiring material.

Figure 3:
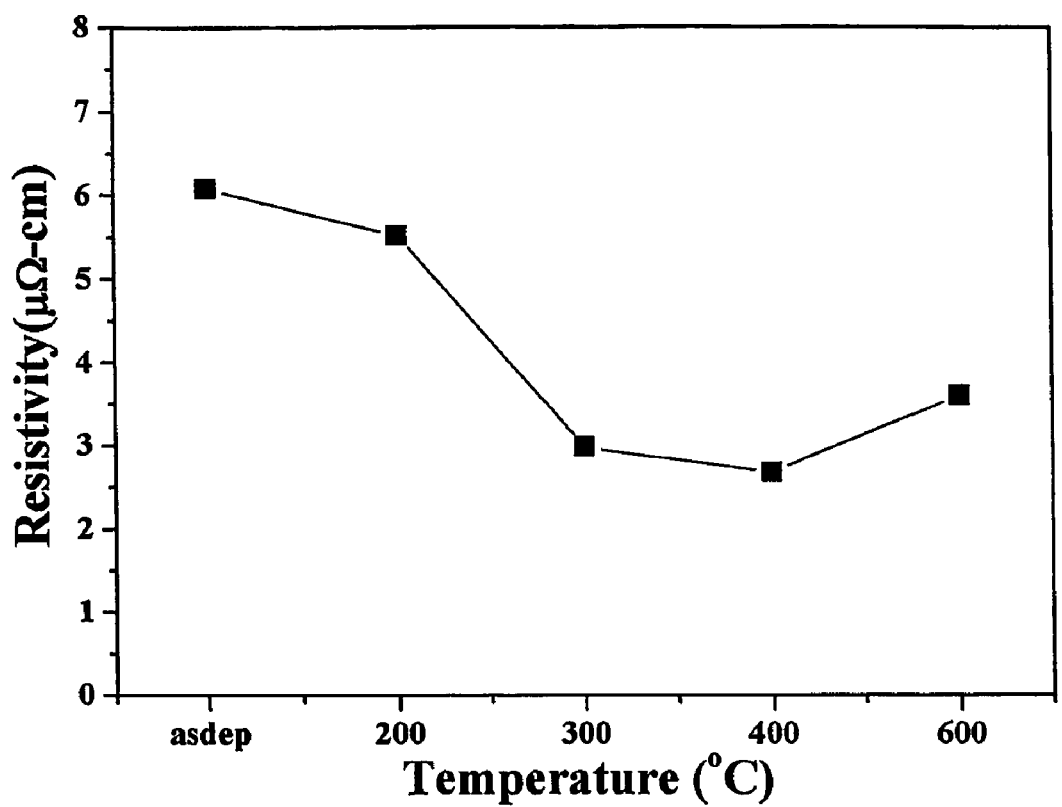
FIG. 3 is a graph that shows change in specific resistance of copper or copper alloy on top of the self-assembled monolayers according to the temperature.

FIG. 3 is a graph that shows change in specific resistance of copper or copper alloy on top of the self-assembled monolayers according to the temperature. In a thin film transistor substrate of the present invention, the self-assembled monolayers formed at the bottom of the copper or copper alloy wiring inhibits reaction of copper with the anti-diffusion film during heat treatment. Therefore, the specific resistance does not increase.

Hereunder is given a specific description of a thin film transistor substrate according to the present invention.

A thin film transistor substrate of the present invention comprises: an insulation substrate; a first signal line formed on the insulation substrate; a first insulation film formed on the first signal line; a second signal line formed on the first insulation film and crossing with the first signal line; a thin film transistor electrically connected with the first signal line and the second signal line; a second insulation film formed on the thin film transistor and having a first contact opening that exposes electrodes of the thin film transistor; and pixel electrodes formed on the second insulation film and connected with electrodes of the thin film transistor through the first contact opening. At least one of the first signal line or the second signal line has a copper or copper alloy wiring comprising a two-layer structure of self-assembled monolayers and a Cu layer.

Referring to the attached drawings, a wiring method of thin film transistor substrate of the present invention is explained below, taking a thin film transistor liquid crystal display as an example.

Figure 4A:
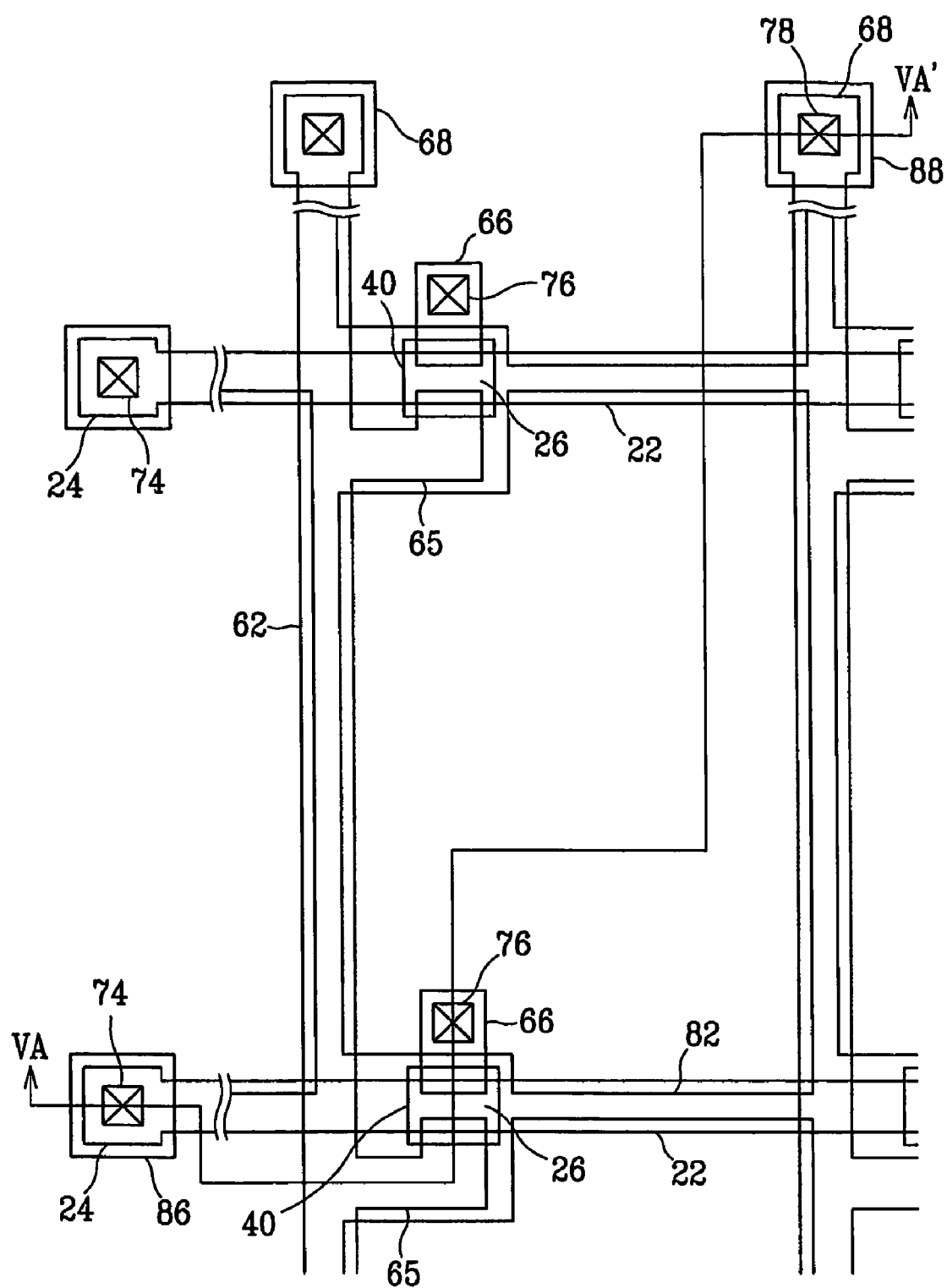
FIGS. 4a and 4b show a thin film transistor substrate for a liquid crystal display of the present invention.
Figure 5A:
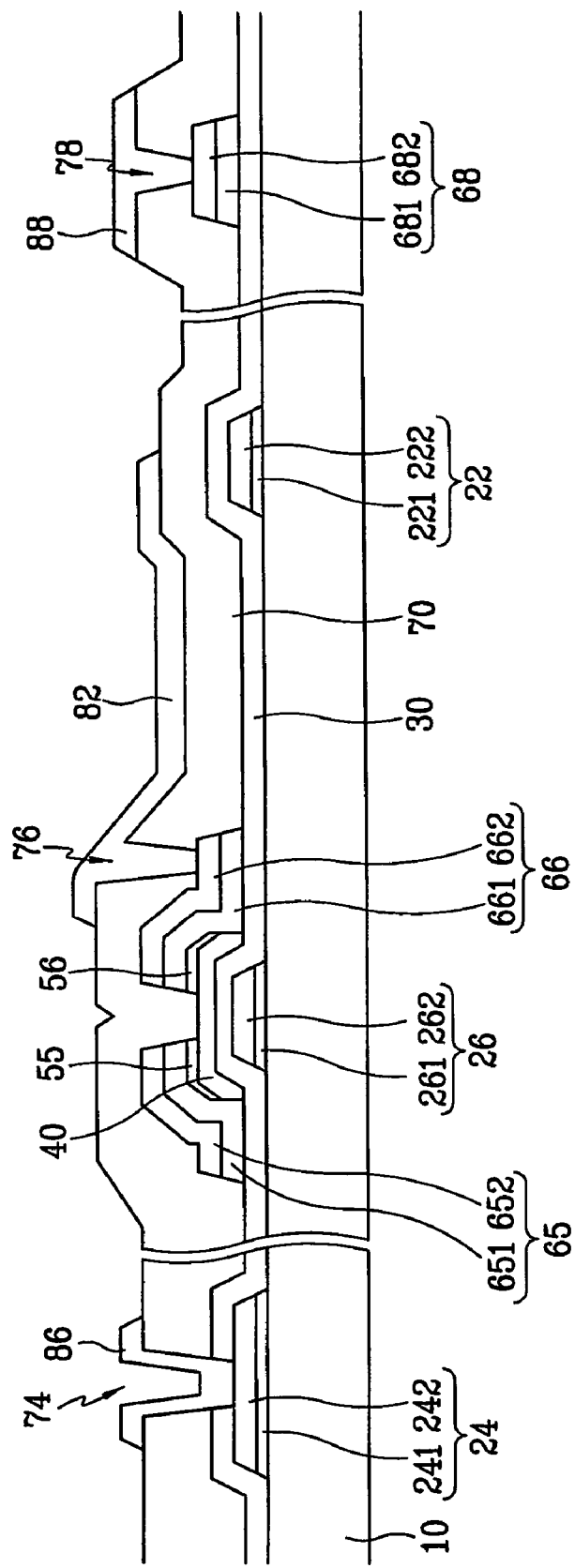
FIGS. 5a and 5b are cross-sectional views along the line V–V' of FIGS. 4a and 4b, respectively.

FIG. 4a shows a thin film transistor substrate for a liquid crystal display of the present invention, and FIG. 5a is a cross-sectional view of the thin film transistor substrate along the line V–V' of FIG. 4a.

A gate wiring 22, 24, 26 having a two-layer structure of first gate wiring layer 221, 241, 261 and a second gate wiring layer 222, 242, 262 is formed on an insulation substrate 10. The first gate wiring layer 221, 241, 261 is made of self-assembled monolayers and the second gate wiring layer 222, 242, 262 is made of copper or copper alloy. The first gate wiring layer 221, 241, 261 is formed to improve adhesion to the substrate 10. Preferably, the first gate wiring layer 221, 241, 261 has a thickness ranging from 2 to 3 nm. The second gate wiring layer 222, 242, 262 functions as a path for electric signal and is made of copper or copper alloy with low specific resistance.

The gate wiring 22, 24, 26 comprises a gate line 22 stretching horizontally and a gate electrode 26 connected with the gate line 22. One end 24 of the gate line 22 has an extended width for connection with an external circuit.

On the substrate 10, a gate insulation film 30 made of a silicon nitride ($SiN_x$), etc. covers the gate wiring 22, 24, 26.

On top of the gate insulation film 30 of the gate electrode 24, a semiconductor layer 40 made of semiconductor like amorphous silicon is formed. And, on the semiconductor layer 40, a ohmic contact layer 55, 56 made of substances like n+ hydrogenated amorphous silicon, wherein silicides or n-type impurities are doped in high concentration, is formed.

On the ohmic contact layer 55, 56 and the gate insulation film 30, a data wiring 62, 65, 66, 68 consisting of two layer of a first data wiring layer 621, 651, 661, 681 and a second data wiring layer 622, 652, 662, 682, is formed. The first data wiring layer 621, 651, 661, 681 is made of self-assembled monolayers, and the second data wiring layer 622, 652, 662, 682 is made of copper or copper alloy. The first data wiring layer 621, 651, 661, 681 is formed to enhance adhesion of the ohmic contact layer 55, 56 to the gate insulation film 30. Preferably, the first data wiring layer 621, 651, 661, 681 has a thickness ranging from 2 to 3 nm. The second data wiring layer 622, 652, 662, 682 functions as a path for electric signal and is made of copper or copper alloy that has low specific resistance.

The data wiring 62, 65, 66, 68 comprises a data line 62 formed vertically and defines a pixel by crossing with the gate line 22, a source electrode 65 branching from the data line 62 and extended to the upper part of the ohmic contact layer 54, and a drain electrode 66 separated from the source electrode 65 and formed on top of the ohmic contact layer 56 on the opposite side of the source electrode 65 with the gate electrode 26 at the center. One end 68 of the data line 62 has a widened width for connection with an external circuit.

On the data wiring 62, 65, 66, 68 and the semiconductor layer 40 not covered by it, a protection film 70 consisting of a silicon nitride (SiNx) film, an a-Si:C:O film or an a-Si:O:F film (low-k CVD film) deposited by the PECVD (plasma enhanced chemical vapor deposition) method, and acrylic insulation film, etc., is formed. The a-Si:C:O film and the a-Si:O:F film (low-k CVD film) deposited by the PECVD method have very low dielectric constant (k ranging from 2 to 4). Accordingly, there arises no problem of parasitic capacitance even with a thin thickness. And, adhesion to other films and step coverage are superior. Also, the inorganic CVD film offers superior heat resistance to organic insulation films. Moreover, the A-Si:C:O film and the a-Si:O:F film (low-k CVD film) deposited by the PECVD method offers 4 to 10 times faster deposition and etching rate than a silicon nitride film.

On the protection film 70, a contact opening 76 exposing the drain electrode 66, a contact opening 78 exposing the end part of the data line 68, and a contact opening 74 exposing the end part of the gate line 24 together with the gate insulation film 30 are formed. The contact openings 74, 78 exposing the end parts of the date line and the gate line 24, 68 may have polygonal or circular shapes. Preferably, areas of the contact openings 74, 78 range from 0.5 mm×15 μm to 2 mm×60 μm.

On the protection film 70, a pixel electrode 82 electrically connected with the drain electrode 66 through the contact opening 76 and located at a pixel area is formed. Also, contact supporting members 86, 88 are formed on the protection film 70 through the contact openings 74, 78. The pixel electrode 82 and the contact supporting members 86, 88 are made of ITO (indium tin oxide) or IZO (indium zinc oxide).

The pixel electrode 82 makes a maintenance capacitor in parallel with the gate line 22, as seen in FIG. 4 and FIG. 5a. In case maintenance capacitance is insufficient, additional wiring may be added in the layer of the gate wiring 22, 24, 26.

The opening ratio can be maximized by having the pixel electrode 82 and the data line 62 overlap. Even if the pixel electrode 82 is overlapped with the data line 62 to maximize the opening ratio, parasitic capacitance can be minimized if a low-k CVD film, etc. is used.

Now, a preparing method of a thin film transistor substrate of the present invention will be explained in detail, referring to FIG. 4, FIG. 5a, and FIGS. 6a to 10b.

Figure 6A:
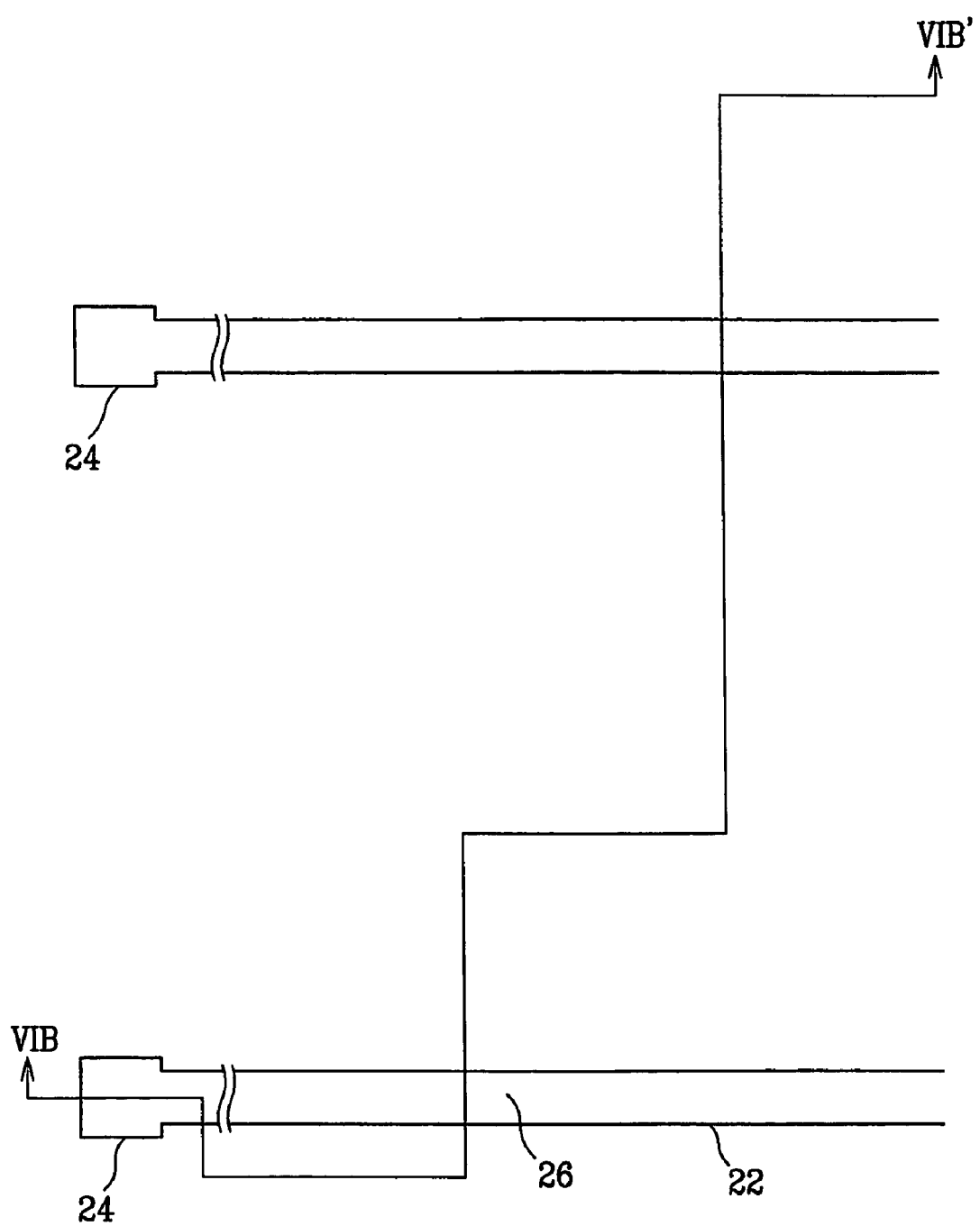
FIGS. 6a, 7a, 8a and 9a show a thin film transistor substrate for a liquid crystal display of the present invention, which is being prepared by a sequential process.
Figure 6B:
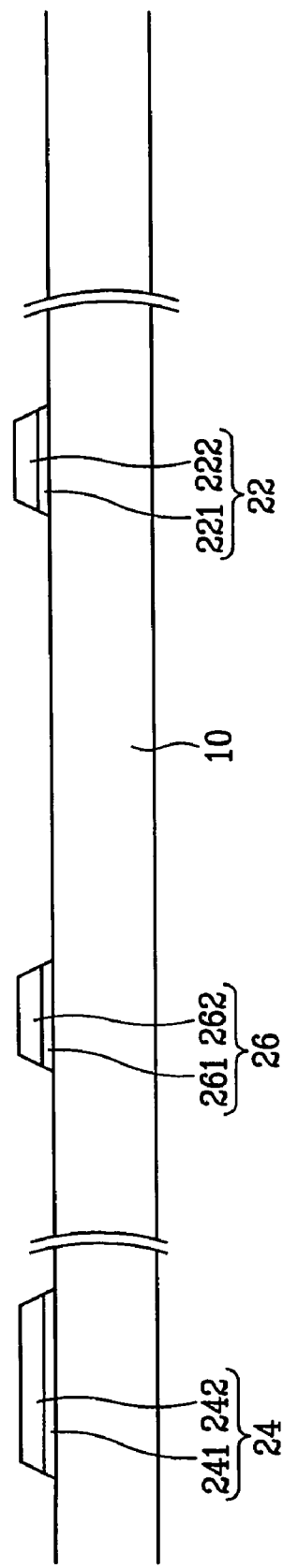

Firstly, a first gate wiring layer 221, 241, 261 and a second gate wiring layer 222, 242, 262 are applied on a substrate 10 and photo-etched to form a gate line 22, a gate electrode 26 and a gate wiring 22, 24, 26 including the end part of the gate line 24 and extending horizontally, as in FIGS. 6a and 6b.

Figure 7A:
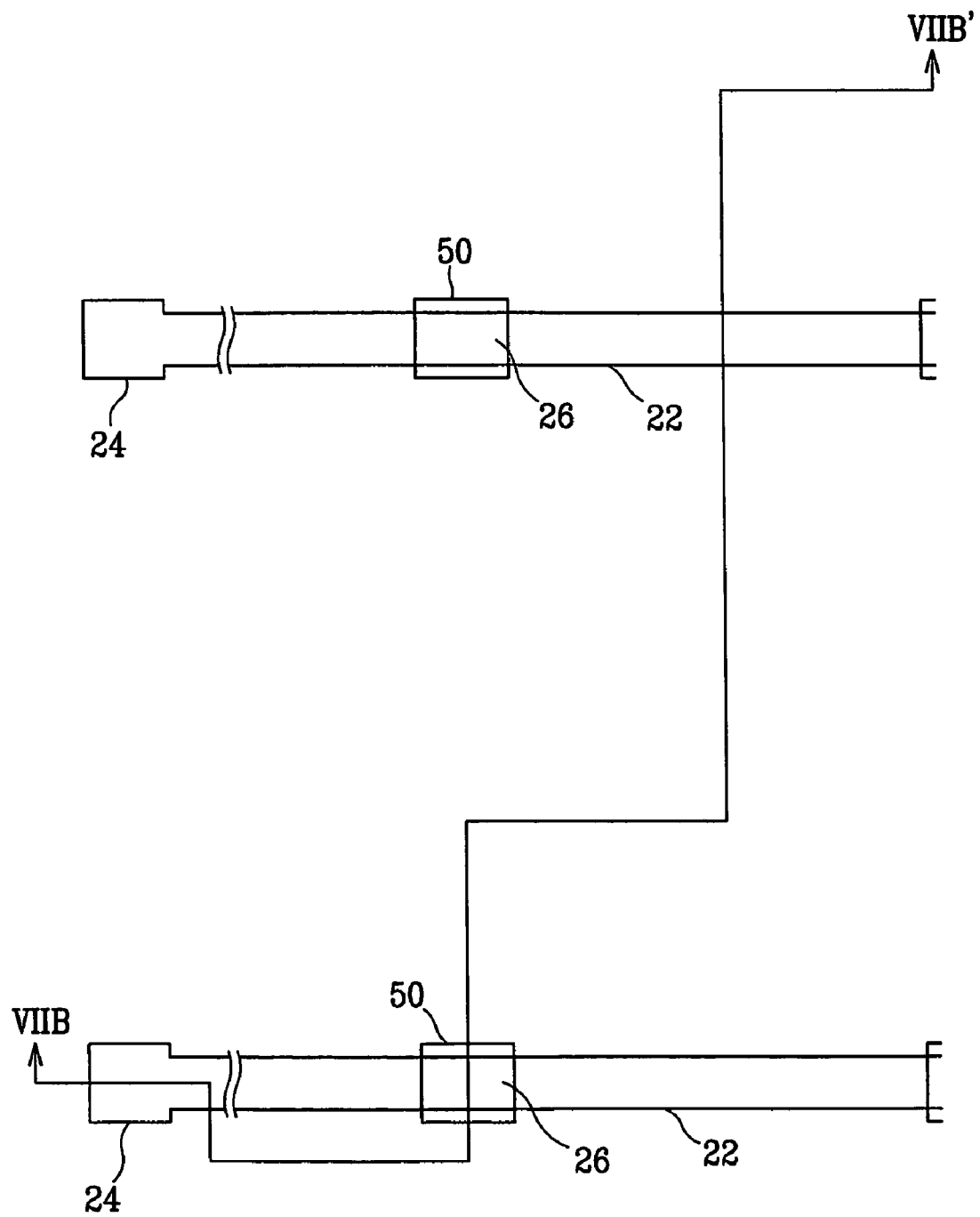

Next, a gate insulation film 30 consisting of silicon nitride, a semiconductor layer 40 consisting of amorphous silicon and a doped amorphous silicon layer 50 are applied, and the semiconductor layer 40 and the doped amorphous silicon layer 50 are photo-etched to form a semiconductor layer 40 and a ohmic contact layer 50 of an island shape on the gate insulation film 30 on top of the gate electrode 24, as in FIGS. 7a and 7b.

Figure 8A:
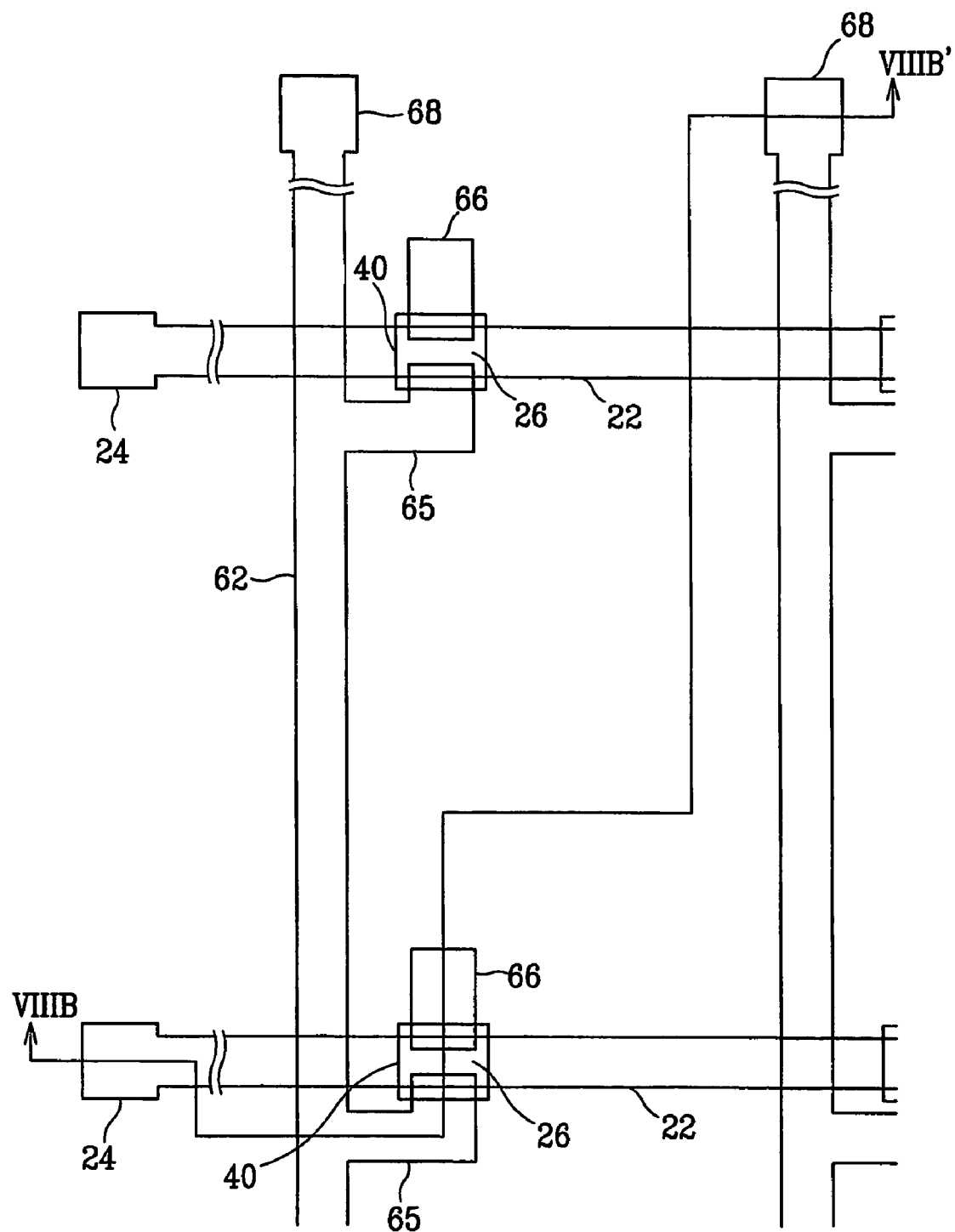
Figure 8B:
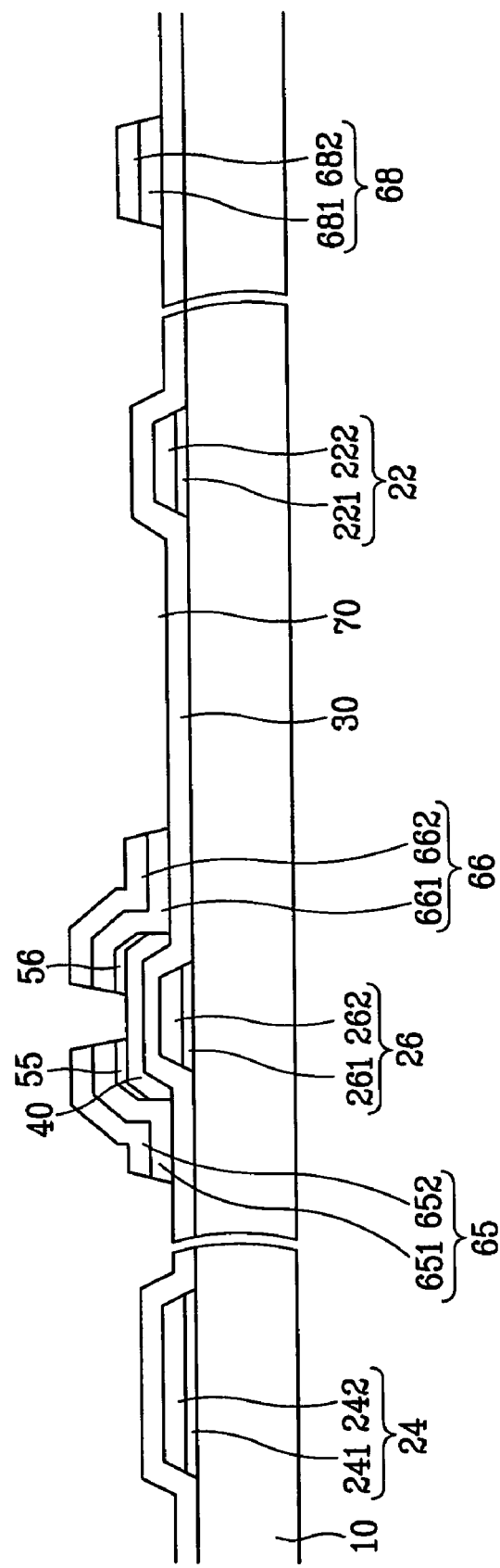
FIG. 8b is a cross-sectional view along the line VIIIb–VIIIb' of FIG. 8a and shows the step next to that of Fig. 7b.

Then, a first data wiring layer 621, 651, 661, 681 and a second data wiring layer 622, 652, 662, 682 are applied and photo-etched to form a data wiring comprising a data line 62 crossing with the gate line 22, a source electrode 65 connected with the data line 62 and extended to the upper part of the gate electrode 26, an end part of the data line 68 connected to the data line 62, and a drain electrode 66 separated from the source electrode 64 and opposing the source electrode 65 with the gate electrode 26 at the center, as in FIGS. 8a and 8b.

Subsequently, an amorphous silicon layer pattern 50 not covered by the data wiring 62, 65, 66, 68 is etched to separate the gate electrode 26 in two parts and to expose a semiconductor layer pattern 40 between the doped amorphous silicon layers 55, 56 on both sides. Preferably, the exposed semiconductor layer 40 surface is stabilized with an oxygen plasma.

Figure 9A:
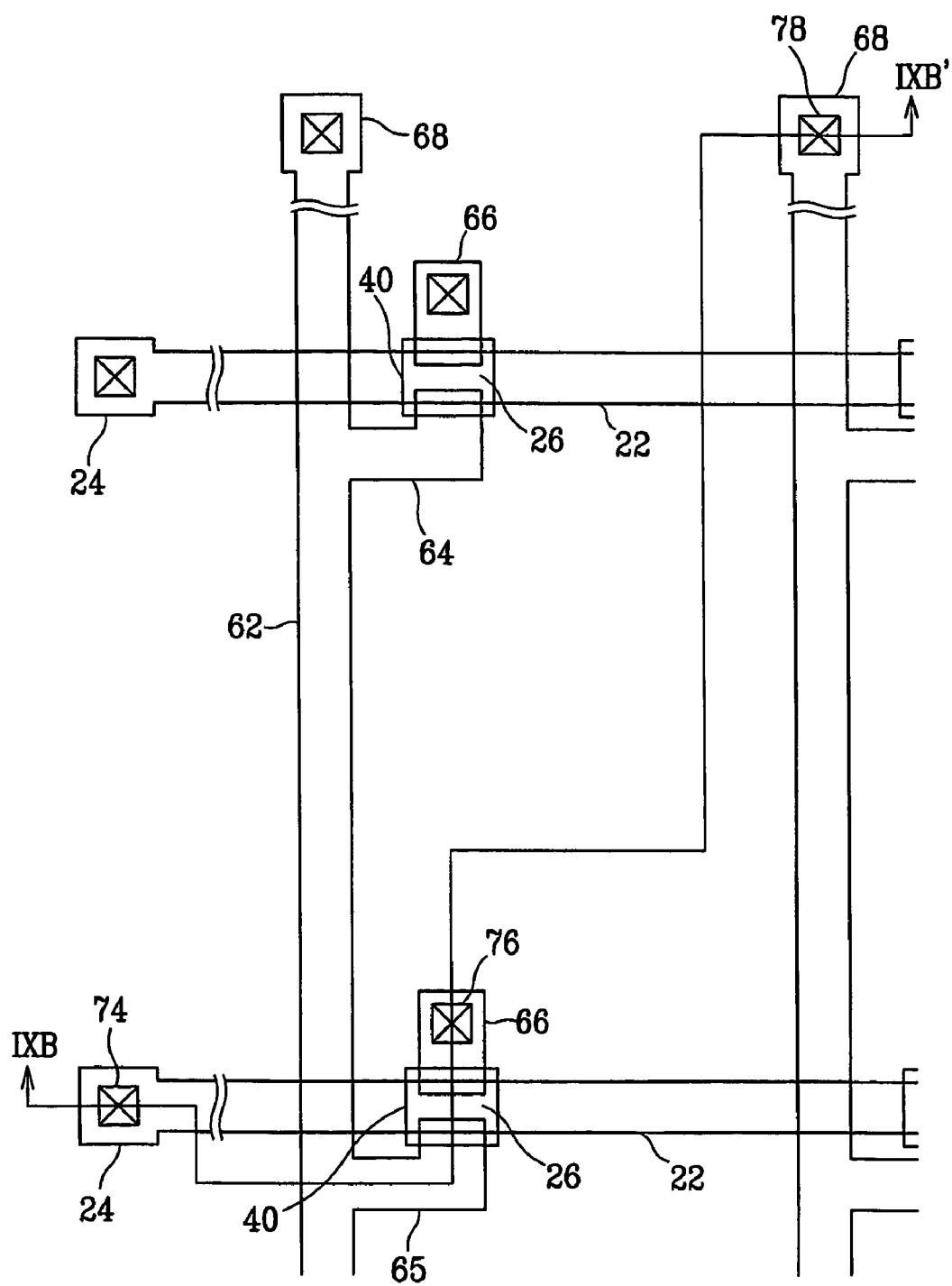
Figure 9B:
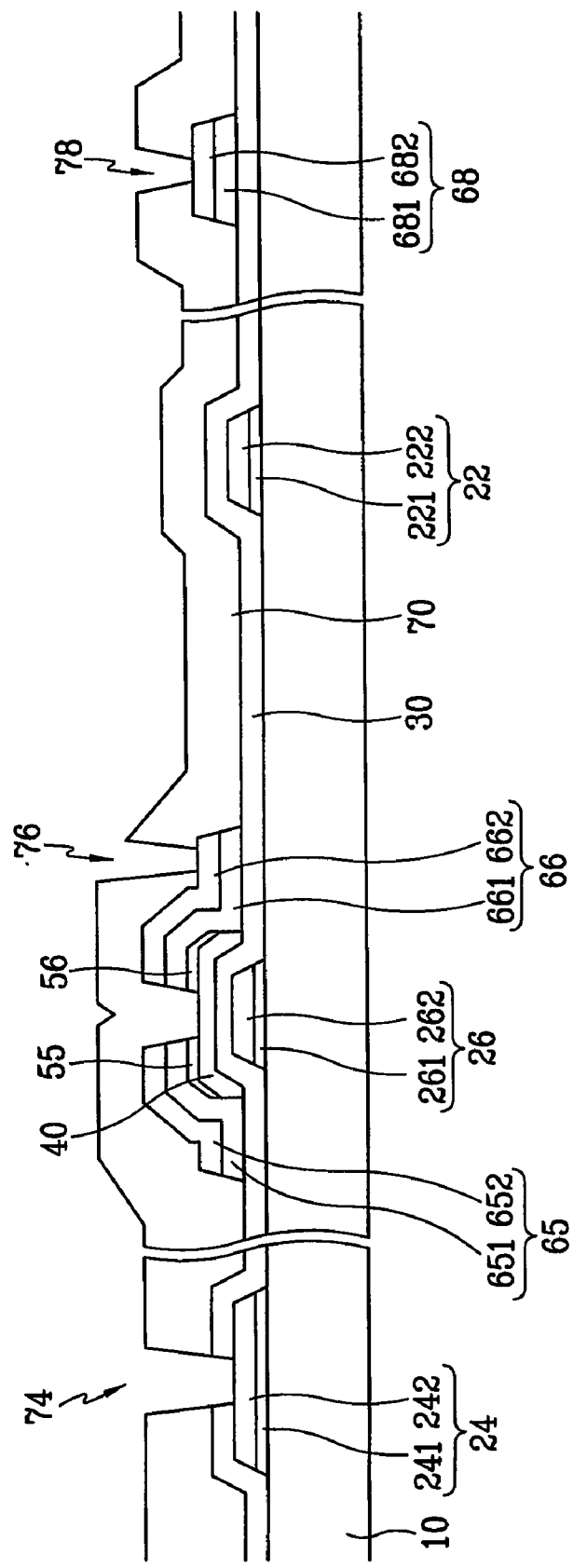
FIG. 9b is a cross-sectional view along the line IXb–IXb' of FIG. 9a and shows the step next to that of FIG. 8b.

Next, a silicon nitride film, an a-Si:C:O film or an a-Si:O:F film is grown by the chemical vapor deposition (CVD) method or an organic insulation film is coated to form a protection film 70, as in FIGS. 9a and 9b.

Subsequently, the gate insulation film 30 and the protection film 70 are patterned by photo-etching to form contact openings 74, 76, 78 that expose the end part of the gate line 24, the drain electrode 66 and the end part of the data line 68. The contact openings 74, 76, 78 may have polygonal or circular shapes. Preferably, areas of the contact openings 74, 78 exposing the end parts 24, 68 range from 0.5 mm×15 μm to 2 mm×60 ƒm.

Lastly, an ITO or IZO film is deposited and photo-etched to form a pixel electrode 82 connected to the drain electrode 66 through the first contact opening 76, an end part of the supporting gate line 86 connected to the end part of the gate line 24 through the second contact opening 74, and an end part of the supporting data line 88 connected to the end part of the data line 68 through the third contact opening 78, as in FIGS. 4 and 5. Preferably, nitrogen gas is used in the pre-heating process before depositing ITO or IZO. This is to prevent formation of a metal oxide film on metal films 24, 66, 68 exposed through the contact openings 74, 76, 78.

As explained above, the gate wiring and the data wiring are made of silver or silver alloy and a protection layer is formed to protect the silver or silver alloy layer and the adhesion layer, in order to offer a low-resistance wiring and improve wiring reliability.

In the present invention, both the gate wiring and the data wiring are formed in two layers. However, only one of the two wirings may be formed in tow layers, if necessary.

Figure 4B:
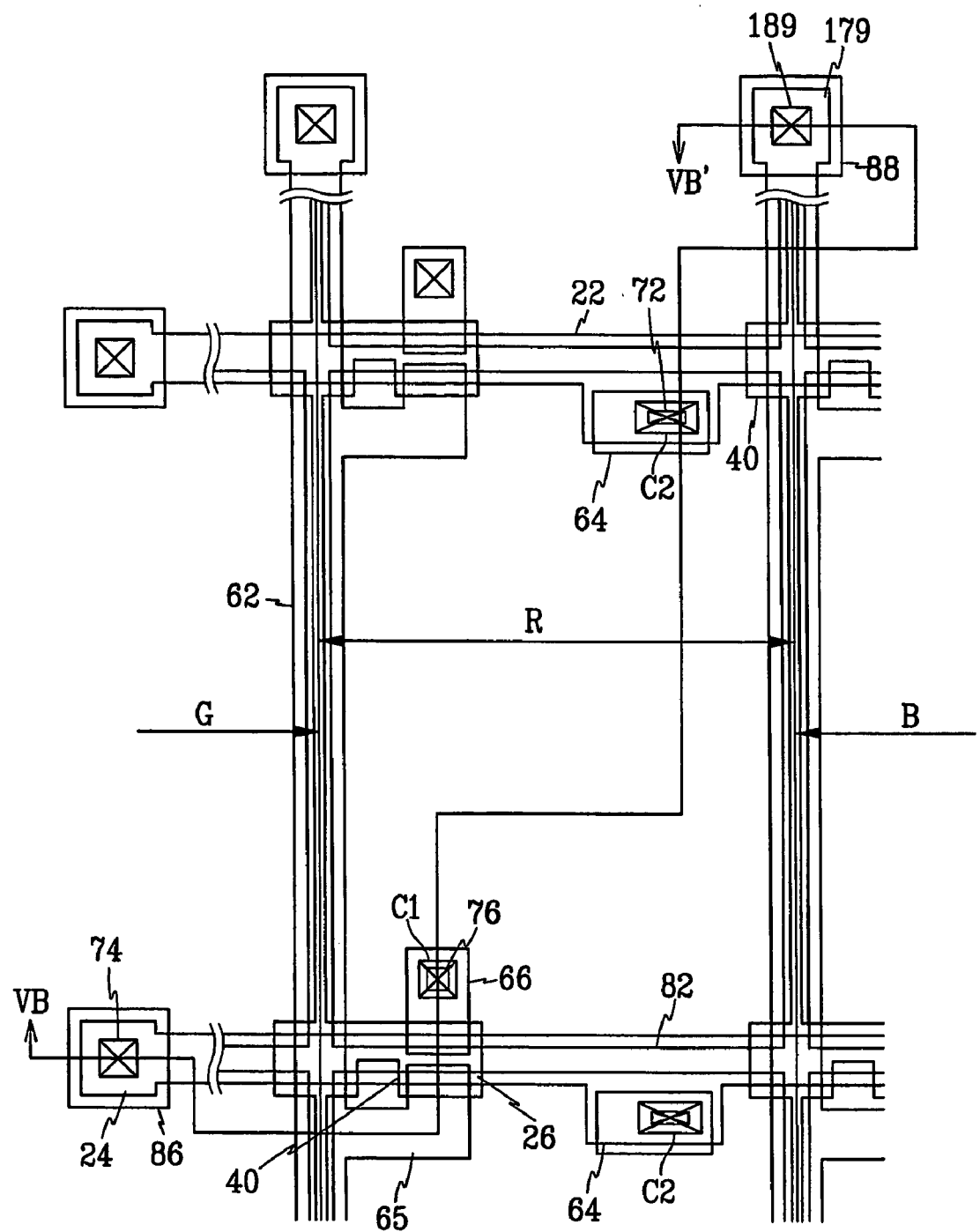
Figure 5B:
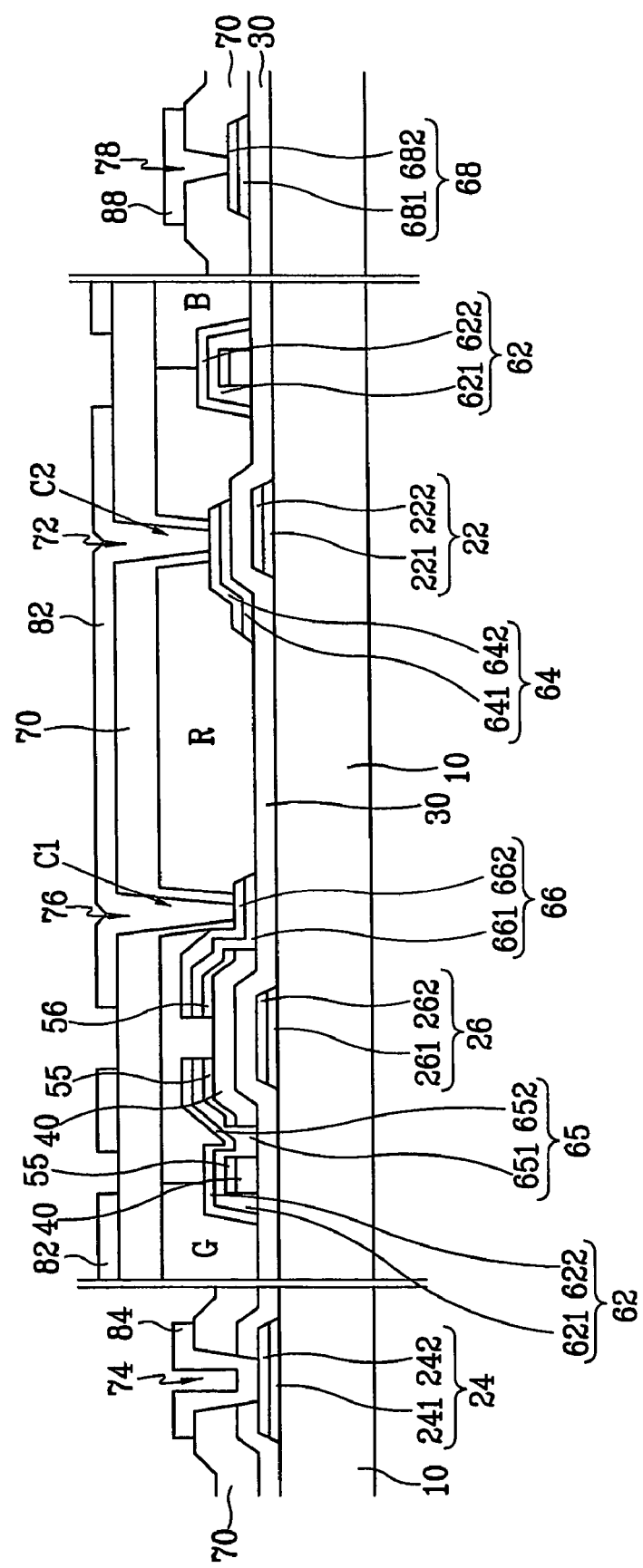

FIG. 5b is a cross-sectional view along the line V–V' of FIG. 4b. It shows a COA (Color filter On Array) structure of a thin film transistor substrate prepared using five masks according to the present invention. The present invention can be equally applied to a COA structure of a thin film transistor substrate prepared with four masks.

A double-layer gate wiring consisting of self-assembled monolayers 241, 221, 261 and a copper layer 242, 222, 262 is formed on an insulation substrate 10. The gate wiring comprises a scanning signal line or a gate line 22 stretching horizontally, and a gate electrode 26 connected to the end of the gate line 22 and accepting scanning signals from outside. A protruding part of the gate line 22 is overlapped with a conductor pattern for maintenance capacitor 64 connected with the pixel electrode 82 to make a maintenance capacitor for improving charge retaining ability of the pixel.

On the gate wiring 22, 24, 26 and the substrate 10, a gate insulation film 30 made of silicon nitride ($SiN_x$), etc. is formed. The gate electrode 24 is covered with a gate insulation film 30.

On the gate insulation film pattern 30, a semiconductor pattern 40 made of semiconductors like hydrogenated amorphous silicon is formed. On the semiconductor pattern 40, an ohmic contact layer 55, 56 made of amorphous silicon, etc. doped with a high concentration of n-type impurities like phosphorus (P) is formed.

On the ohmic contact layer 55, 56, a source electrode 65 and a drain electrode 66 made of conductors like Mo or MoW alloy, Cr, Al or Al alloy, Ta, etc. are formed. The data wiring is formed vertically and also comprises a data line 62 formed vertically and connected with the source electrode 65, a data pad 68 connected to one end of the data line 62 and accepting picture signals from outside, and a conductor pattern for maintenance capacitor 64 overlapping with the protruding part of the gate line 22.

Preferably, the data wiring 62, 64, 65, 66, 68 also has a two-layer structure of self-assembled monolayers 621, 641, 651, 661, 681 and copper layer 622, 642, 652, 662, 682, like the gate wiring 22, 24, 26, or a three-layer structure of self-assembled monolayers, silver layer and copper layer.

The ohmic contact layer 55, 56 lowers contact resistance of the semiconductor pattern 40 and the data wiring 62, 64, 65, 66, 68.

Although not depicted on the figures, an inter-layer insulation film made of insulators like silicon oxide or silicon nitride may be formed on the data wiring 62, 64, 65, 66, 68 and the semiconductor pattern 40 not covered by the data wiring.

In the pixel area on the gate insulation film 30, red, green and blue color filters (R, G, B) having openings C1, C2 that expose the drain electrode 65 and the conductor pattern for maintenance capacitor 64 are formed vertically. Although the boundaries of the red, green and blue color filters (R, G, B) are depicted to fit the upper part of the data line 62, they may block lights leaked out of the pixel area.

On the red, green and blue color filters 81, 82, 83, a protection film 70 made of acrylic organic insulation material or SiOC or SiOF having good flattening property and dielectric constant lower than 4.0 is formed by the chemical vapor deposition. This protection film 90 has contact openings 74, 78, 76, 72 that expose the end part of the gate line 24, the end part of the data line, the drain electrode 66 and the conductor pattern for maintenance capacitor 64, together with the gate insulation film 30. The contact openings 76, 72 that expose the drain electrode 66 and the conductor pattern for maintenance capacitor 64 are located inside of the openings C1, C2 of the color filters (R, G, B). As explained above, the same pattern as that of the inter-layer insulation film is obtained, if an inter-layer insulation film is added to the lower part of the color filters (R, G, B).

On the protection film 70, a pixel electrode 82 accepting picture signals from the thin film transistor and generating an electric field together with the electrode of the upper layer is formed. The pixel electrode 82 is made of transparent conducting material like ITO (indium tin oxide) or IZO (indium zinc oxide), and is connected with the drain electrode 66 physically and electrically to accept picture signals. The pixel electrode 82 is overlapped with the gate line 22 and the data line 62 to enhance the opening ratio. However, they may not be overlapped. The pixel electrode 82 is also connected with the conductor pattern for maintenance capacitor 64 through the contact opening 72 to transfer picture signals to the conductor pattern 64. On the end part of the gate line 24 and the end part of the data line 68, contact supporting members 84, 88 connected with the end parts 24,68 through the contact openings 74, 78 are formed. The contact supporting members 84, 88 support adhesion of the end part of the data line 68 and the end part of the gate line 24 to external circuits and protect the pad. Use of the contact supporting members 84, 88 is not mandatory but optional.

The above method can be equally applied to preparation of a thin film transistor substrate for a liquid crystal display using four masks.

Figure 10:
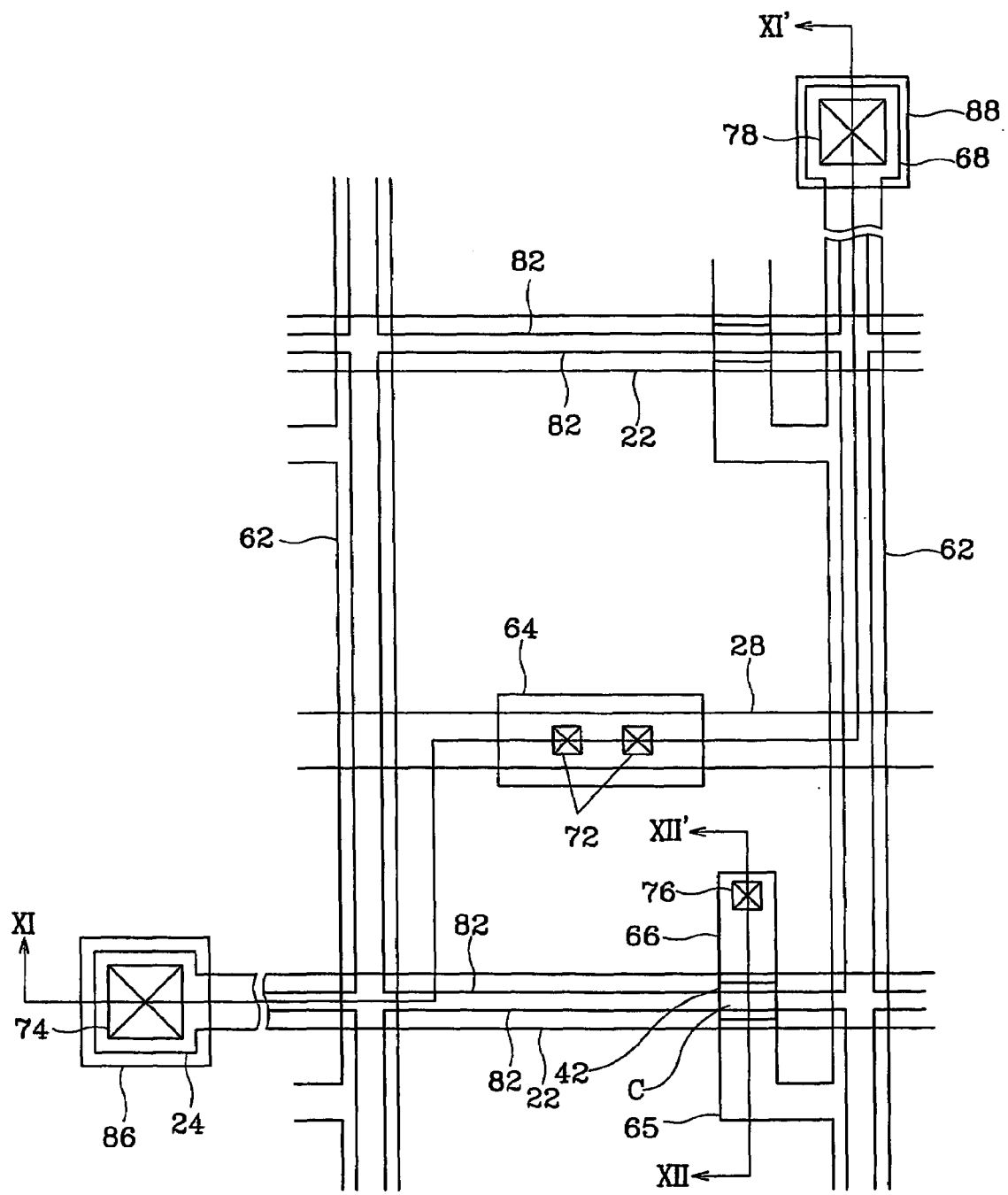
FIG. 10 is a diagrammatic view of a thin film transistor substrate for a liquid crystal display of the present invention.
Figure 11:
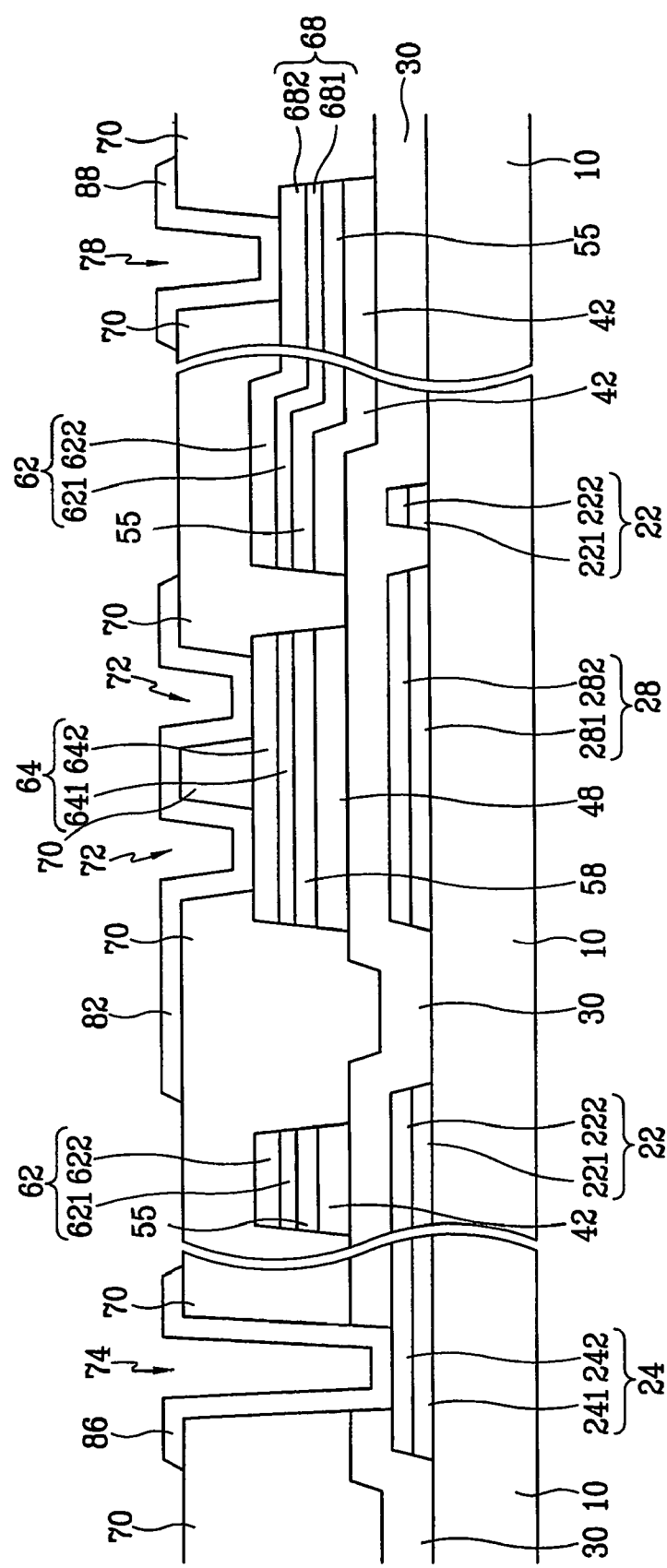
FIG. 11 is a cross-sectional view along the line XI–XI' of FIG. 10.
Figure 12:
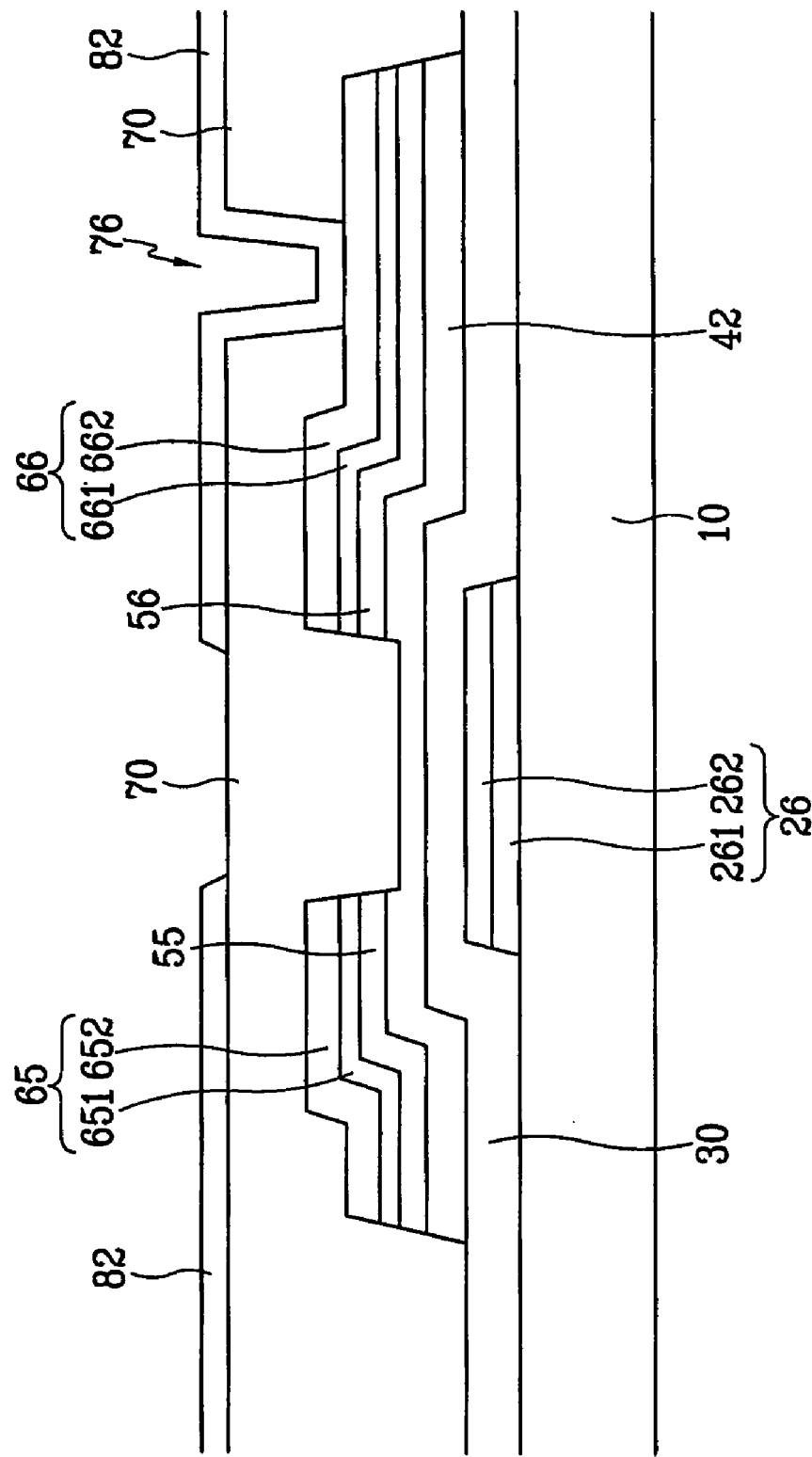
FIG. 12 is a cross-sectional view along the line XII–XII' of FIG. 10.

Referring to FIGS. 10 to 12, a unit pixel structure of a thin film transistor substrate for a liquid crystal display according to the present invention prepared with four masks will be explained in detail.

FIG. 10 is a diagrammatic view of a thin film transistor substrate for a liquid crystal display according to a second example of the present invention, and FIG. 11 and FIG. 12 are cross-sectional views along the lines XI–XI' and XII–XII' of FIG. 10, respectively.

Firstly, a gate wiring 22, 24, 26 comprising a double layer of the first gate wiring layer 221, 241, 262 and the second gate wiring layer 222, 242, 262 is formed on an insulation substrate 10 as in the first example. The first gate wiring layer 221, 241, 261 is made of self-assembled monolayers and the second gate wiring layer 222, 242, 262 is made of copper or copper alloy. The first gate wiring layer 221, 241, 261 is formed to improve adhesion to the substrate 10. Preferably, the first gate wiring layer 221, 241, 261 has a thickness ranging from 2 to 3 nm. The second gate wiring layer 222, 242, 262 functions as a path for electric signal and is made of copper or copper alloy with low specific resistance. The gate wiring comprises a gate line 22, and end part of the gate line 24 and a gate electrode 26.

On the substrate 10, a maintenance electrode line 28 is formed parallel to the gate line 22. The maintenance electrode line 28 also has a two-layer structure of a first gate wiring layer 281 and a second gate wiring layer 282. The maintenance electrode line 28 is overlapped with a conductor pattern for maintenance capacitor 68 connected with a pixel electrode 82 to make a maintenance capacitor for improving charge retaining ability of the pixel. If the maintenance capacitance due to the overlap of the pixel electrode 82 and the gate line 22 is insufficient, the maintenance electrode line 28 may not be formed. It is common that a voltage equal to that applied to the common electrode of the upper substrate is applied to the maintenance electrode line 28.

On the gate wiring 22, 24, 26 and the maintenance electrode line 28, a gate insulation film 30 made of silicon nitride ($SiN_x$), etc. is formed. The gate insulation film 30 covers the gate wiring 22, 24, 26 and the maintenance electrode line 28.

On the gate insulation film 30, a semiconductor pattern 42, 48 made of semiconductors like hydrogenated amorphous silicon is formed. On the semiconductor pattern 42, 48, an ohmic contact layer pattern or an intermediate layer pattern 55, 56, 58 made of amorphous silicon, etc. doped with a high concentration of n-type impurities like phosphorus (P) is formed.

On the ohmic contact layer pattern 55, 56, 58, a data wiring 62, 64, 65, 66, 68 having a three-layer structure of a first data wiring layer 621, 641, 651, 661, 681 and a second data wiring layer 622, 642, 652, 662, 682 is formed. The first data wiring layer 621, 641, 651, 661, 681 is made of self-assembled monolayers and the second data wiring layer 622, 642, 652, 662, 682 is made of copper or copper alloy. The first data wiring layer 621, 641, 651, 661, 681 is formed to improve adhesion of the ohmic contact layer 55, 56 to the gate insulation film 30. Preferably, the first data wiring layer 621, 641, 651, 661, 681 has a thickness ranging from 2 to 3 nm. The second data wiring layer 622, 642, 652, 662, 682 functions as a path for electric signals and is made of copper or copper alloy having low specific resistance. The data wiring comprises a data line 62 formed vertically, an end part of the data line 68 connected with one end of the data line 62 and accepting picture signals from outside, and a data line part 62, 68, 65 consisting of a source electrode 65 branching from the data line 62. It also comprises a drain electrode 66 separated from the data line part 62, 68, 65 and located at the opposite side of the source electrode 65 with reference to a channel part ⓒ, and a conductor pattern for maintenance capacitor 64 located on a maintenance electrode line 28. In case the maintenance electrode line 28 is not formed, the conductor pattern for maintenance capacitor 64 is not formed, either.

A contact layer pattern 55, 56, 58 lowers contact resistance of the semiconductor pattern 42, 48 and the data wiring 62, 64, 65, 66, 68. It has a structure completely identical to that of the data wiring 62, 64, 65, 66, 68. That is, the intermediate layer pattern of the data line part 55 is identical to the data line part 62, 68, 65; an intermediate layer pattern for a drain electrode 56 is identical to the drain electrode 66; and an intermediate layer pattern for a maintenance capacitor 58 is identical to the conductor pattern for maintenance capacitor 64.

The semiconductor pattern 42, 48 has a structure identical to that of the data wiring 62, 64, 65, 66, 68 and the ohmic contact layer pattern 55, 56, 58 except the channel part ⓒ of the thin film transistor. To be specific, the semiconductor pattern for maintenance capacitor 48, the conductor pattern for maintenance capacitor 64 and the contact layer pattern for maintenance capacitor 58 have the same structure, but the semiconductor pattern for a thin film transistor 42 is a little different from the other part of the data wiring and the contact layer pattern. That is, while the data line part 62, 68, 65, especially the source electrode 65 is separated from the drain electrode 66 and the intermediate layer of the data line part 55 and the contact layer pattern for a drain electrode 56 are separated from each other at the channel part ⓒ of the thin film transistor, the semiconductor pattern for a thin film transistor 42 is connected at the channel part ⓒ to form a channel for the thin film transistor.

On the data wiring 62, 64, 65, 66, 68, a protection film 70 consisting of a silicon nitride film, an a-Si:C:O film or an a-Si:O:F film (low-k CVD film) deposited by the PECVD (plasma enhanced chemical vapor deposition) method or an organic insulation film is formed. The protection film 70 has contact openings 76, 78, 72 that expose the drain electrode 66, the end part of the data line 64 and the conductor pattern for maintenance capacitor 68. It also has a contact opening 74 that exposes the end part of the gate line 24 together with the gate insulation film 30.

On the protection film 70, a pixel electrode 82 is made of transparent conducting material like ITO (indium tin oxide) or IZO (indium zinc oxide), and is connected with the drain electrode 66 physically and electrically to accept picture signals. The pixel electrode 82 is overlapped with the gate line 22 and the data line 62 to enhance the opening ratio. However, they may not be overlapped. The pixel electrode 82 is also connected with the conductor pattern for maintenance capacitor 64 through the contact opening 72 to transfer picture signals to the conductor pattern 64. On the end part of the gate line 24 and the end part of the data line 68, an end part of a supporting gate line 86 and an end part of a supporting data line 88 connected through the contact openings 74, 78 are formed. These support adhesion of the end parts 24, 68 to external circuits and protect them. Use of the end part of a supporting gate line 86 and the end part of a supporting data line 88 is not mandatory but optional.

Now, a method of preparing a thin film transistor substrate for a liquid crystal display having the structure of FIG. 10 to FIG. 12 with four masks will be explained in detail, referring to FIGS. 11 to 13 and FIGS. 13*a* to 20*c*.

Figure 13A:
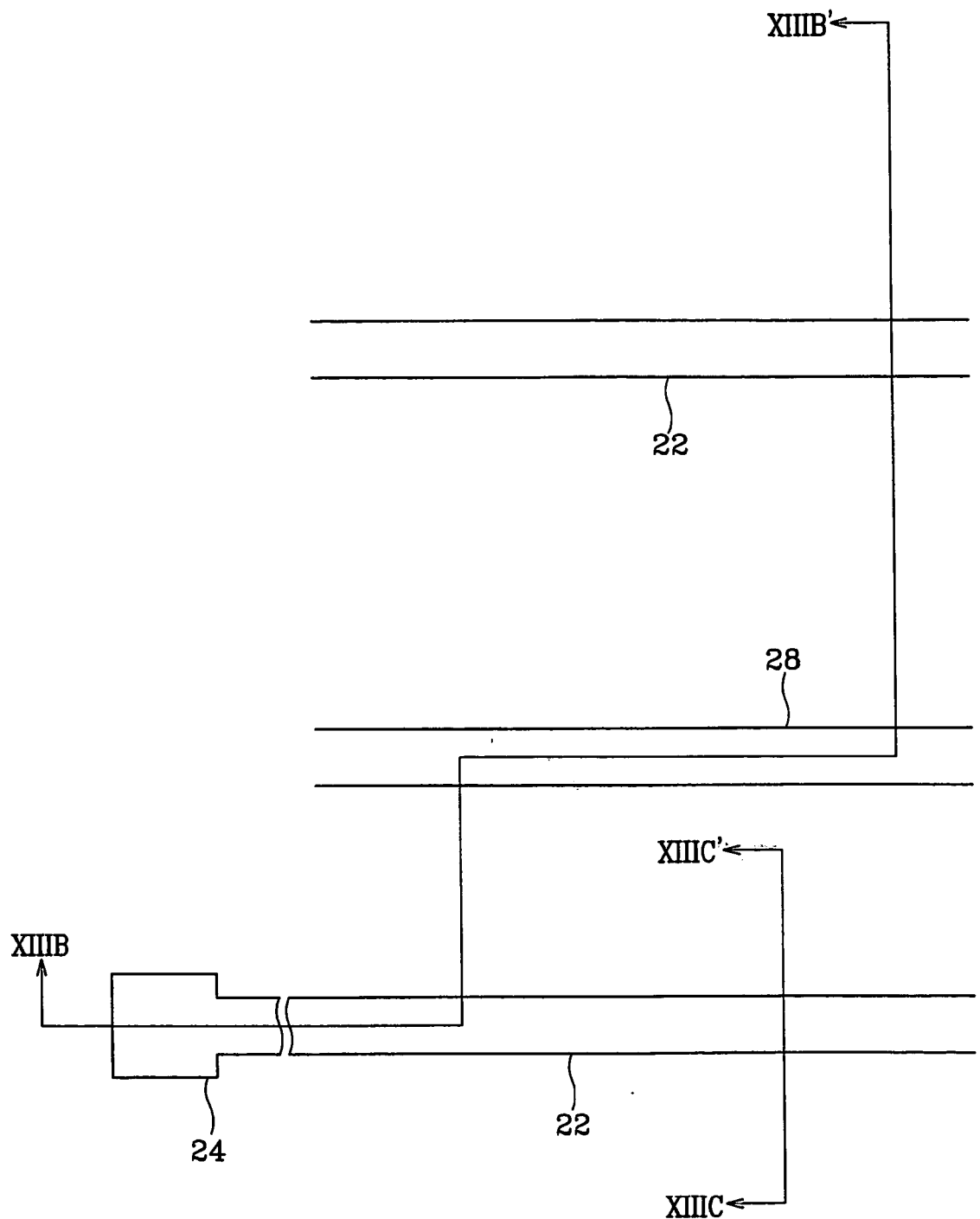
FIG. 13a is a diagrammatic view of a thin film transistor substrate for a liquid crystal display of the present invention.
Figure 13B:
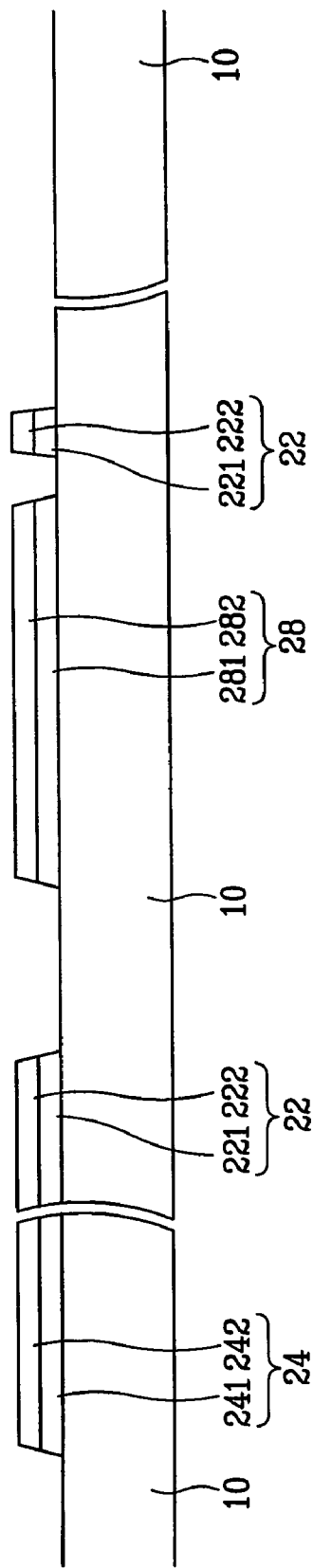
FIGS. 13b and 13c are cross-sectional views along the lines XIIIb–XIIIb' and XIIIc–XIIIc' of FIG. 13a, respectively.
Figure 13C:
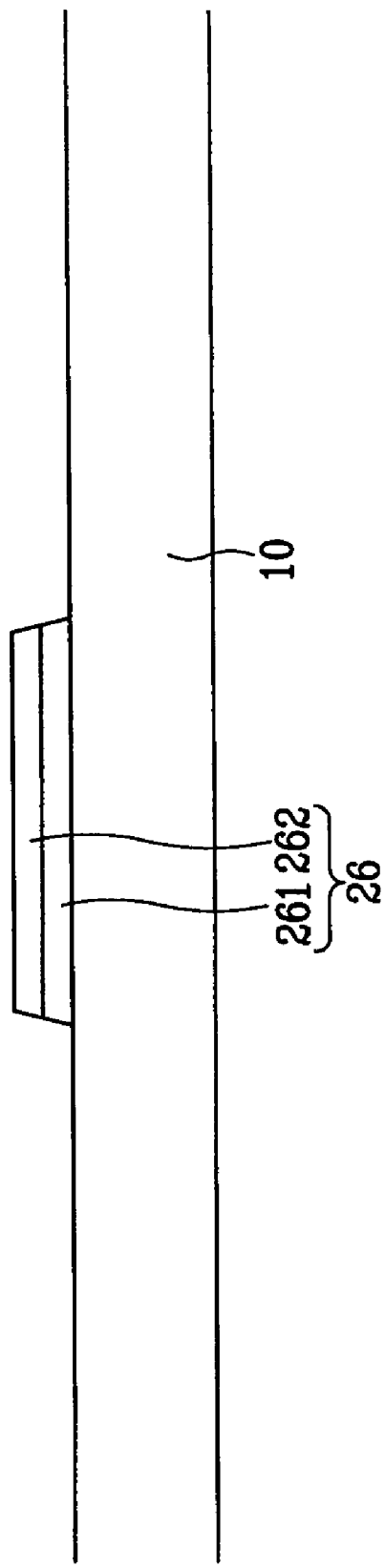

Firstly, a first gate wiring layer 221, 241, 261, 281 and a second gate wiring layer 222, 242, 262, 282 are applied as in the first example, and photo-etched to form a gate wiring comprising a gate line 22, an end part of the gate line 24 and a gate electrode 26, and a maintenance electrode line 28, as in FIGS. 13*a* to 13*c*.

Figure 14A:
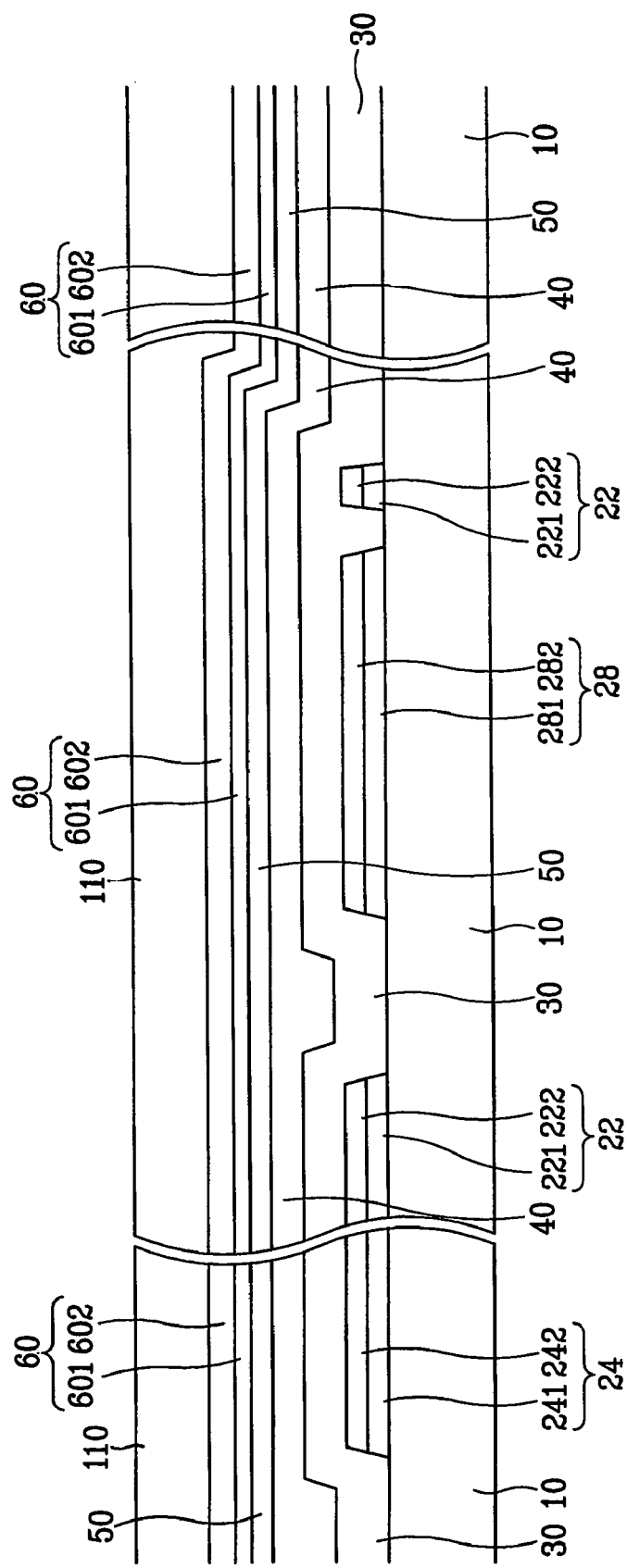
FIGS. 14a and 14b are cross-sectional views along the lines XIIIb–XIIIb' and XIIIc–XIIIVc' of FIG. 13a, respectively, which show the step next to that of FIG. 13b and FIG. 13c.
Figure 14B:
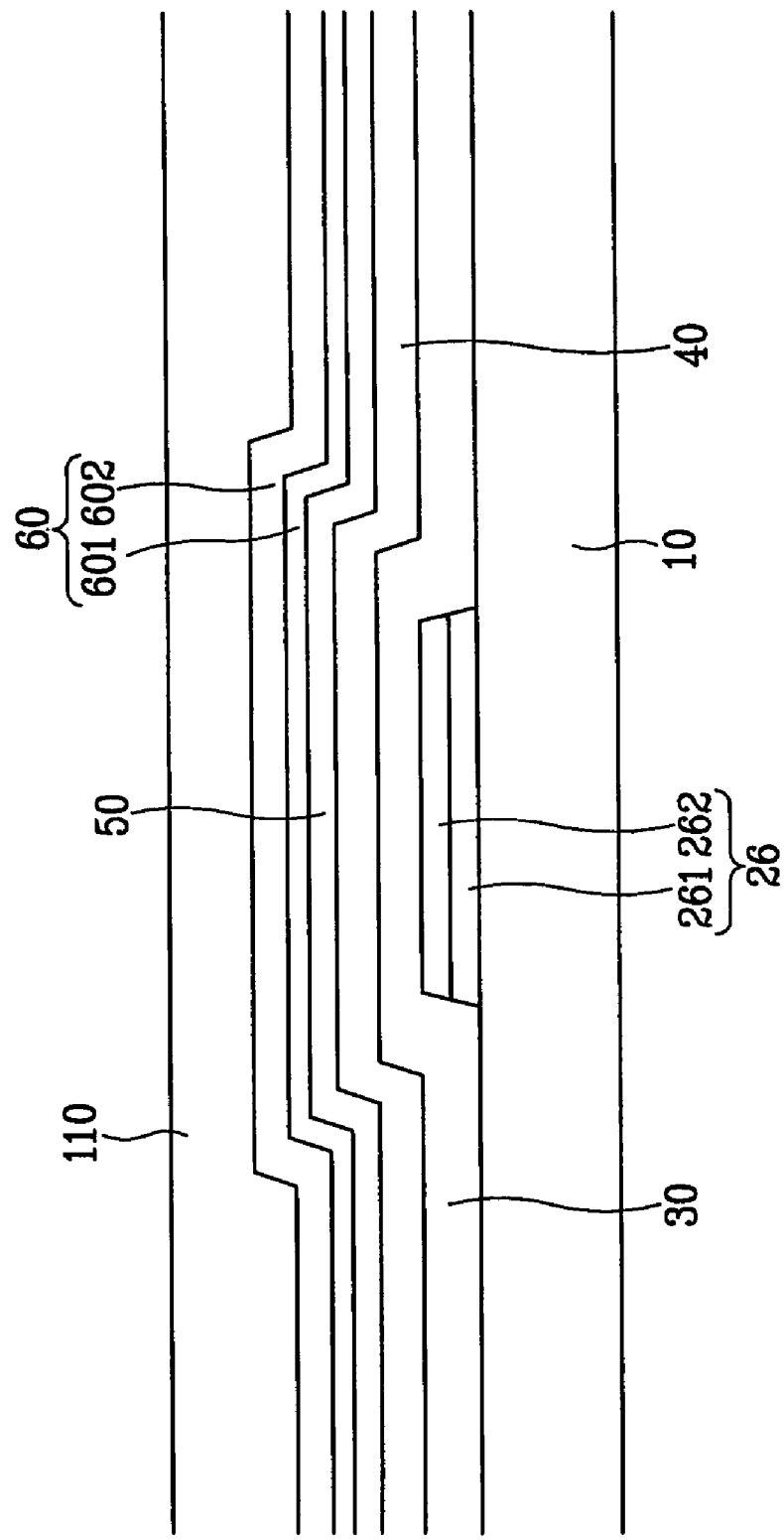

Next, a gate insulation film 30 consisting of silicon nitride, a semiconductor layer 40 and an intermediate layer 50 are continuously deposited by the chemical vapor deposition method to the thicknesses ranging from 1,500 Å to 5,000 Å, from 500 Å to 2,000 Å and from 300 Å to 600 Å, respectively, as in FIGS. 14*a* and 14*b*. Then, a first conduction film 601 and a second conduction film 602 for forming a data wiring are deposited by the sputtering method, etc. to form a conductor layer 60. Then, a photosensitive film 110 is applied to 1 µm to 2 µm of thickness on it.

Figure 15A:
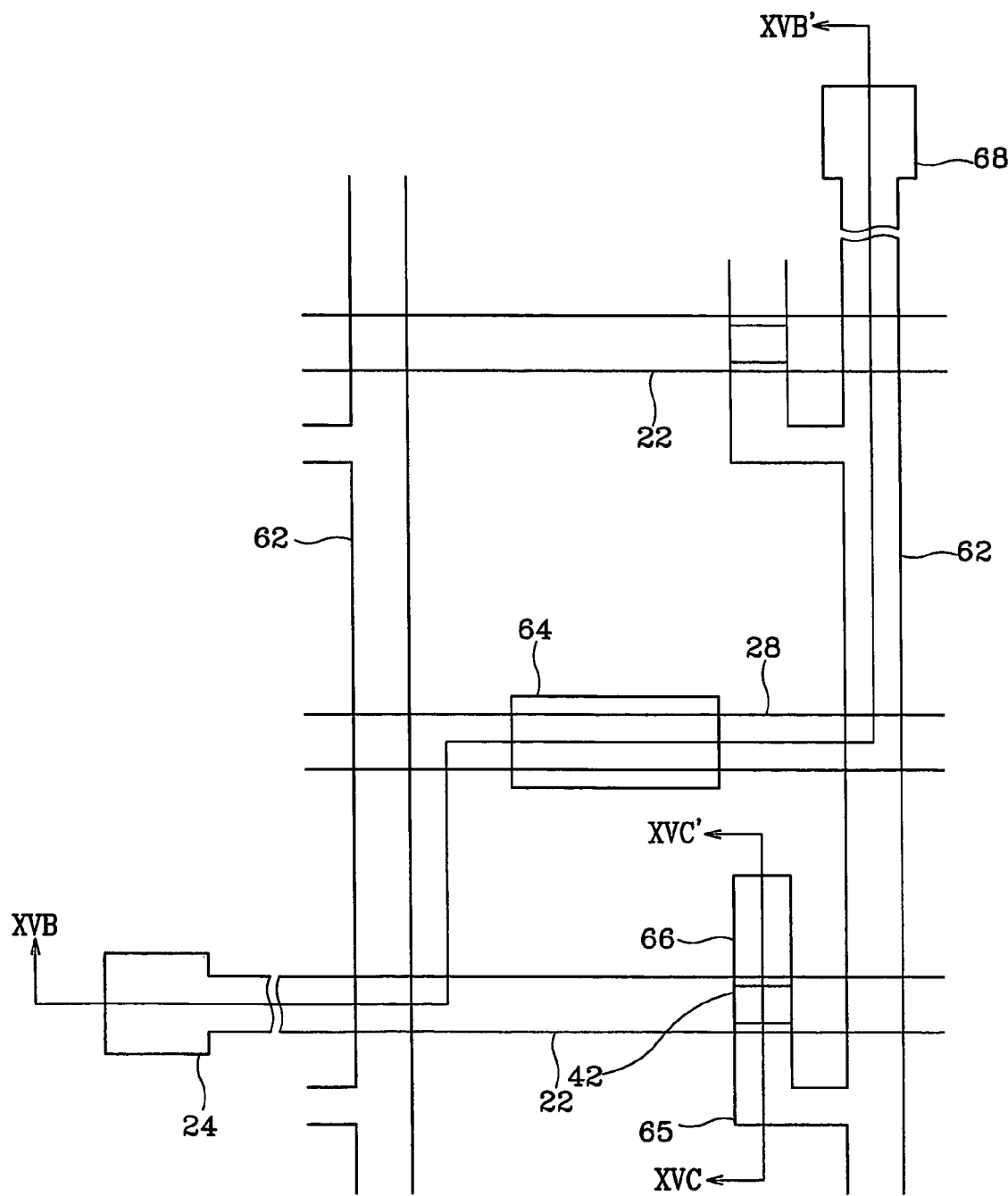
FIG. 15a is a diagrammatic view of a thin film transistor substrate at the step next to that of FIGS. 14a and 14b.
Figure 15B:
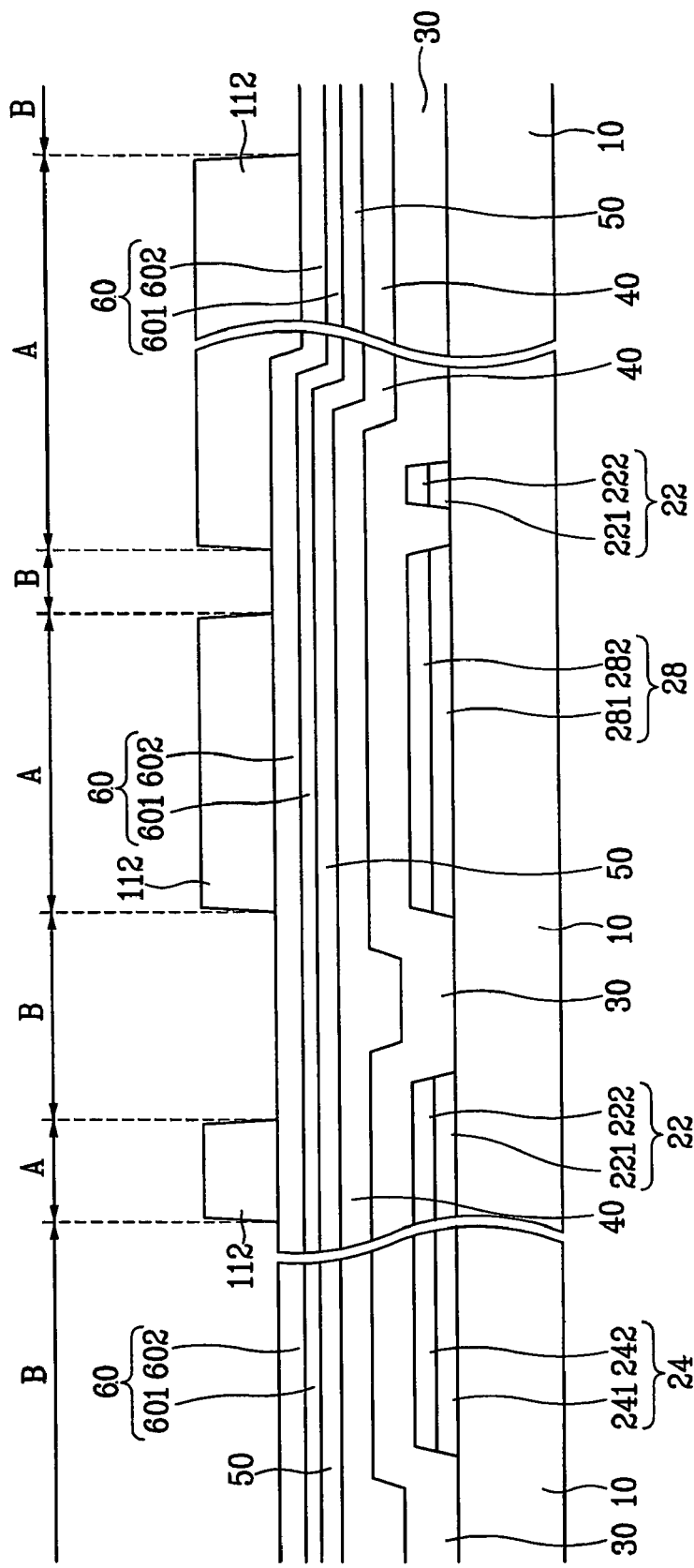

Then, the photosensitive film 110 is exposed to light through a mask and developed to form a photosensitive film pattern 112, 114, as in FIGS. 15*b* and 15*c*. In the photosensitive film pattern 112, 114, the channel part ⓒ of the thin film transistor, or the first part 114 between the source electrode 65 and the drain electrode 66, is formed to have smaller thickness than the data wiring part (A), or the second part 112 wherein the data wiring 62, 64, 65, 66, 68 will be formed. In the remaining part (B), the photosensitive film is completely removed. The thickness ratio of the photosensitive film 114 remaining in the channel part (C) and the photosensitive film 112 remaining in the data wiring part (A) shall be different according to the etching condition. Preferably, the tackiness of the first part 114 is smaller than ½ of the tackiness of the second part 112. For example, it is preferred to be smaller than 4,000 Å.

The thickness of the photosensitive film can be varied in many ways. Typically, a slit- or lattice-type pattern is formed or a semi-transparent film is used to control light transmission to the (A) part.

Preferably, the linewidth or gap of the slit pattern is smaller than the resolution of a light exposing means. In case a semi-transparent film is used, thin films with different transmissivity or thin films with different thickness may be used.

If light is exposed to the photosensitive film using such a mask, polymers are completely decomposed at the part where the light contacts directly. In the part where a slit pattern or a semi-transparent film is formed, polymers are not completely decomposed. In the part where covered by a shading film, polymers are hardly decomposed. If the photosensitive film is developed, only the part where polymers are not decomposed remain. Therefore, the part exposed to a small amount of light has a smaller thickness than the part not exposed to light. The exposing time should not be too long, lest all polymers should be decomposed.

Such a thin photosensitive film 114 can also be formed by using a photosensitive film made of reflowable material and a usual mask having light-transmitting and non-transmitting parts, and exposing, developing and reflowing the photosensitive film, so that part of the photosensitive film flows to the part where no photosensitive film remains.

Then, the photosensitive film pattern 114 and the films below it, that is the conductor layer 60, the intermediate layer 50 and the semiconductor layer 40, are etched. In the data wiring part (A), the data wiring and the films below it should remain; in the channel part (C), only the semiconductor layer should remain; and in the remaining part (B), all the three layers 60, 50, 40 should be removed to expose the gate insulation film 30.

Figure 16A:
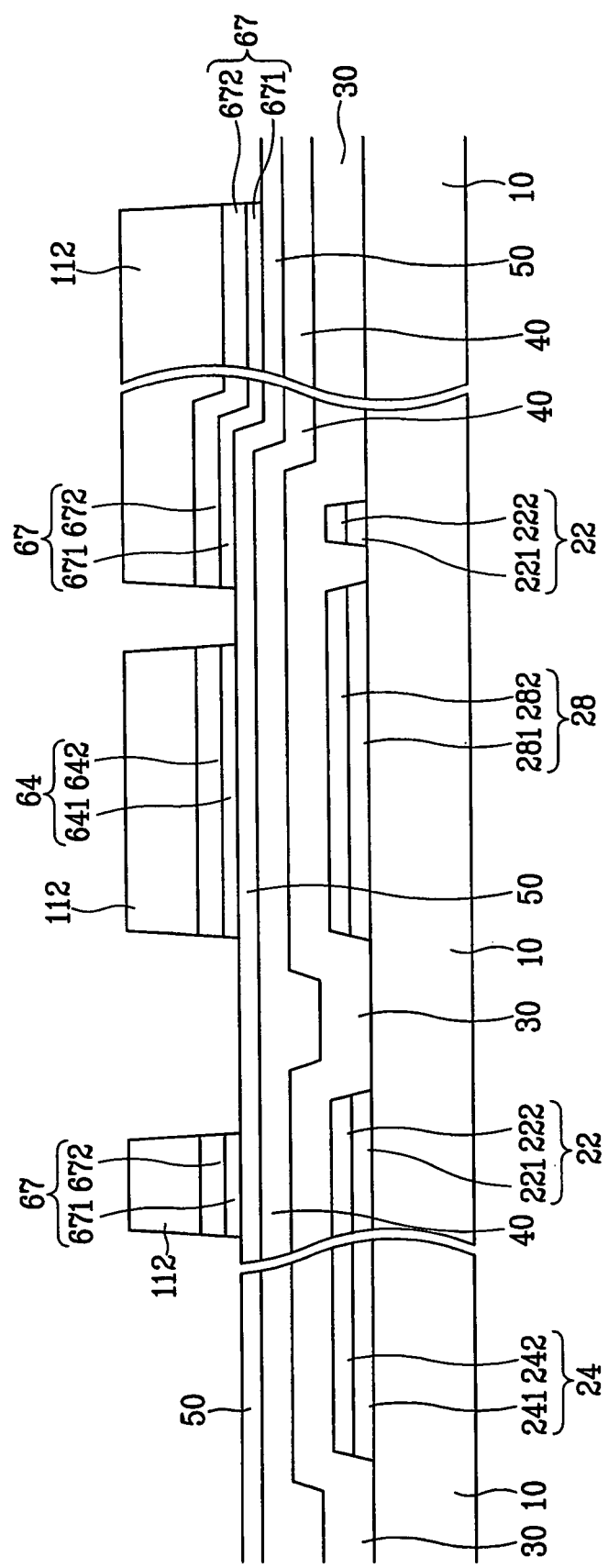
Figure 16B:
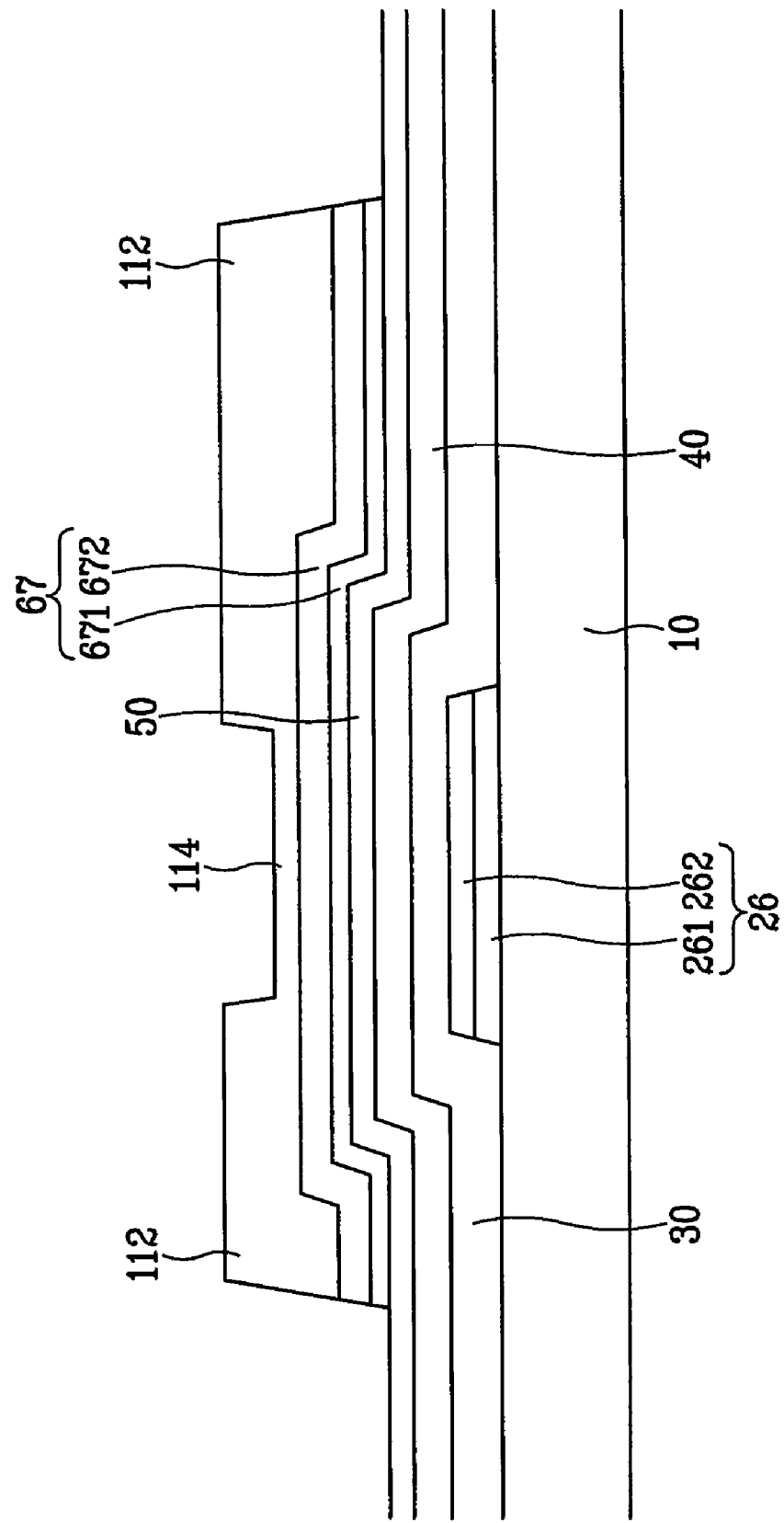

The exposed conductor layer 60 of the remaining part B is removed to expose the intermediate layer 50 below it, as in FIGS. 16*a* and 16*b*. In this process, either dry etching or wet etching method can be used. Preferably, the etching is performed under a condition where the conductor layer 60 is etched and the photosensitive film pattern 112, 114 is hardly etched. However, because it is difficult to find such a condition for dry etching, a condition where the photosensitive film pattern 112, 114 is also etched is allowed. In this case, the first part 114 should be thicker than for wet etching, lest the first part 114 should be removed to expose the conductor layer 60 below it.

As a result of this process, only the conductor layer of the channel part (C) and the and data wiring part (B), that is the conductor pattern for source/drain 67 and the conductor pattern for maintenance capacitor 68, remain and the conductor layer 60 of the remaining part (B) is completely removed to expose the intermediate layer 50 below it, as in FIGS. 16*a* and 16*b*. The remaining conductor pattern 67, 64 has a structure identical to that of the data wiring 62, 64, 65, 66, 68, except that the source electrode 65 and the drain electrode 66 are not separated but connected with each other. In case dry etching is used, the photosensitive film pattern 112, 114 is also etched to some degree.

Figure 17A:
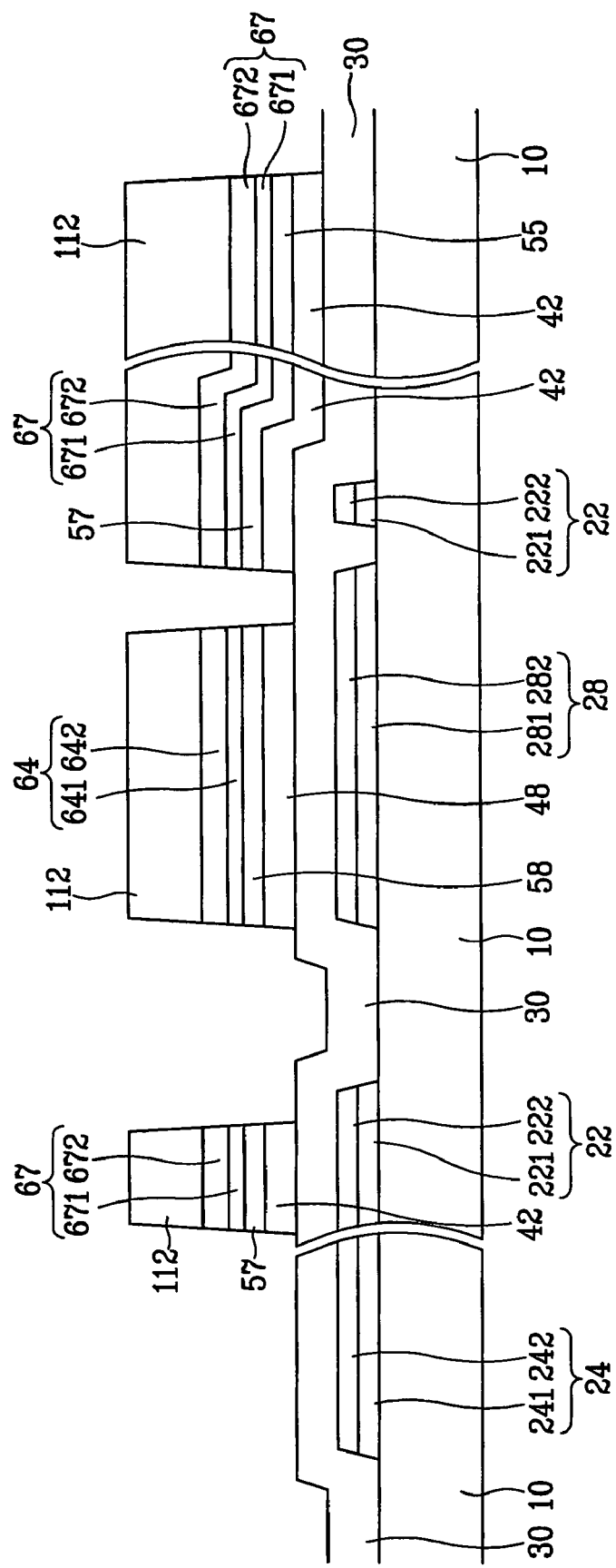
Figure 17B:
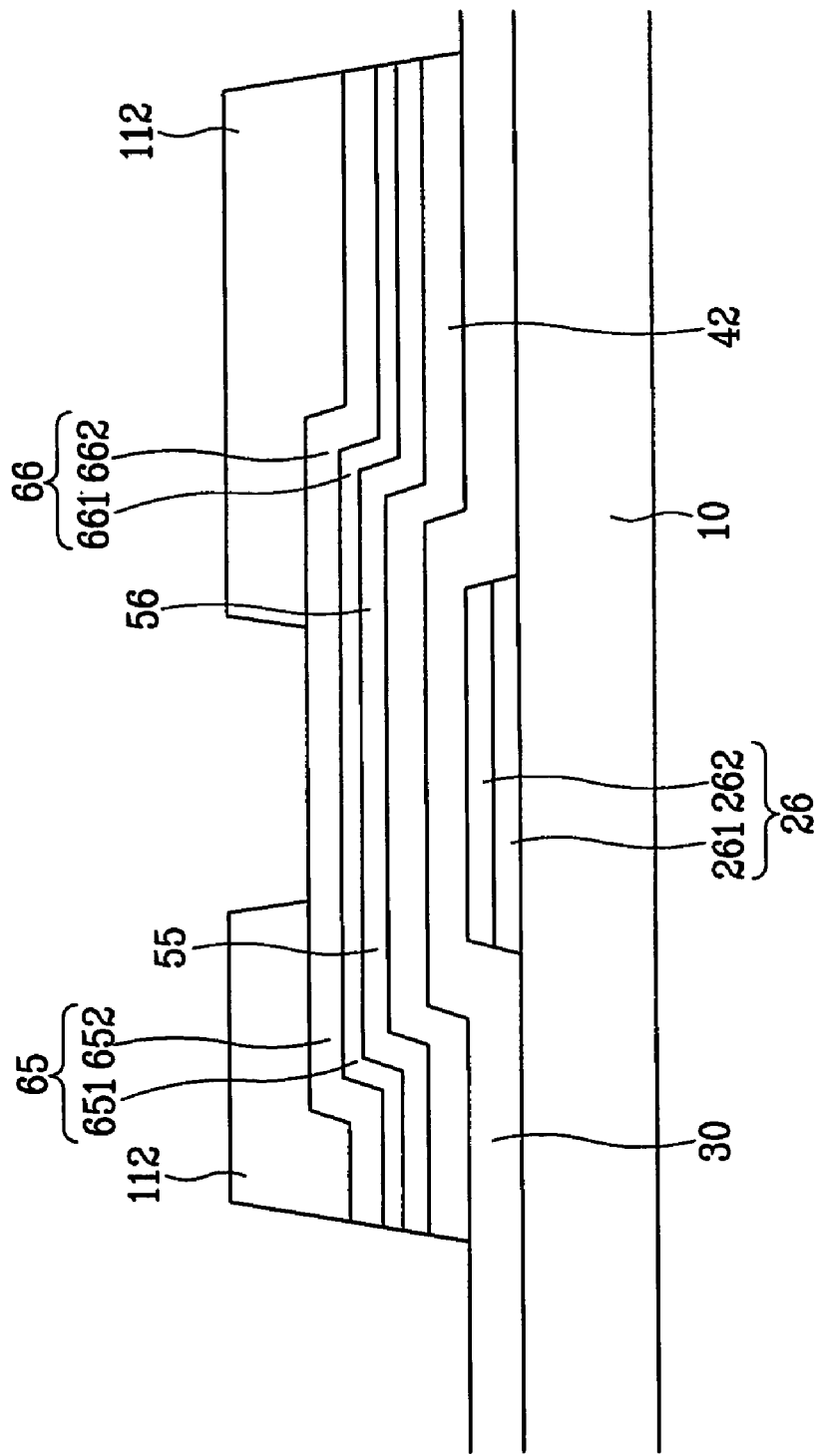

Next, the exposed intermediate layer 50 of the remaining part (B) and the semiconductor layer 40 below it are removed by dry etching along with the first part 114 of the photosensitive film, as in FIGS. 17a and 17b. Preferably, the etching is performed under a condition where photosensitive film pattern 112, 114, the intermediate layer 50 and the semiconductor layer 40 are etched simultaneously (the semiconductor layer and the intermediate layer have little etching selectivity) but the gate insulation film 30 is not etched. Especially, it is preferred that the photosensitive film pattern 112, 114 and the semiconductor layer 40 are etched with almost the same etching ratios. For example, a mixture gas of $SF_6$ and HCl or a mixture gas of $SF_6$ and $O_2$ may be used to etch the two films to almost the same thickness. In case the etching ratios of the photosensitive film pattern 112, 114 and the semiconductor layer 40 are identical, thickness of the first part 114 should be equal to or smaller than the sum of thicknesses of the semiconductor layer 40 and the intermediate layer 50.

As a result, the first part 114 of the channel part (C) is removed to expose the conductor pattern for source/drain 67 and the intermediate layer 50 and the semiconductor layer 40 of the remaining part (B) are removed to expose the gate insulation film 30 below them, as in FIGS. 17a and 17b. Also, the second part 112 of the data wiring part (A) is etched. In this process, a semiconductor pattern 42, 48 is completed. The drawing symbol 57 refers to an intermediate layer pattern below the conductor pattern for source/drain 67, and the drawing symbol 58 refers to an intermediate layer pattern below the conductor pattern for maintenance capacitor 64.

Photosensitive film remnants remaining on the surface of the conductor pattern for source/drain 67 of the channel part (C) are removed by ashing.

Figure 18A:
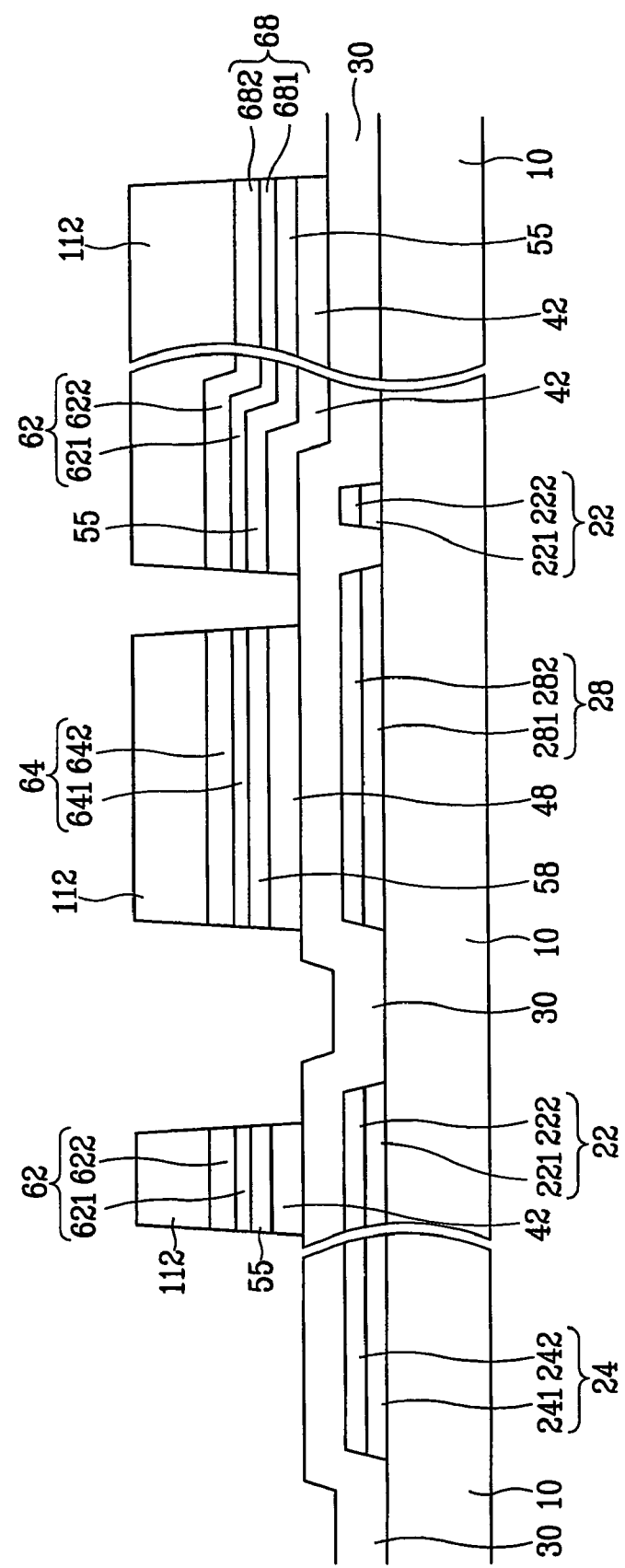

Next, the conductor pattern for source/drain 67 of the channel part (C) and the intermediate layer pattern for source/drain 57 below it are removed by etching, as in FIGS. 18a and 18b. Both the conductor pattern for source/drain 67 and the intermediate layer pattern 57 may be dry-etched; or it is possible to wet-etch the conductor pattern for source/drain 67 and dry-etch the intermediate layer pattern 57. In the former case, a condition where the etching selection ratio of the conductor pattern for source/drain 67 and the intermediate layer pattern 57 is large is preferred. It is because if the etching selection ratio is not large, it is difficult to find the etching terminal point, so that it is difficult to control the thickness of the semiconductor pattern 42 remaining in the channel part (C). In the latter case, a staircase shape is obtained because while the side of the conductor pattern for source/drain 67 is etched, the intermediate layer pattern 57 is hardly etched. Examples of an etching gas used to etch the intermediate layer pattern 57 and the semiconductor pattern 42 are a mixture gas of $CF_4$ and HCl and a mixture gas of $CF_4$ and $O_2$. If a mixture gas of $CF_4$ and $O_2$ is used, a semiconductor pattern 42 having a uniform thickness can be obtained. In this process, part of the semiconductor pattern 42 may be removed to reduce the thickness and the second part 112 of the photosensitive film pattern is also etched to some degree, as seen in FIG. 15b. The etching is performed under a condition where the gate insulation film 30 is not etched. A thick photosensitive film pattern is preferable lest the second part 112 should be removed to expose the data wiring 62, 64, 65, 66, 68 below it.

As a result, the source electrode 65 and the drain electrode 66 are separated from each other and a data wiring 62, 64, 65, 66, 68 and a contact layer pattern 55, 56, 58 below it are completed.

Lastly, the second part of the photosensitive film 112 remaining in the data wiring part (A) is removed. Removal of the second part 112 may also be performed after removing the conductor pattern for source/drain 67 of the channel part (C) and before removing the intermediate layer pattern 57 below it.

As explained above, wet etching and dry etching can be used in turns or only dry etching may be used. While the latter case is convenient in that only one type of etching is used, it is difficult to find a favorable etching condition. On the other hand, while the former case is advantageous in finding a favorable etching condition, the etching process is more complicated than the latter case.

Figure 19A:
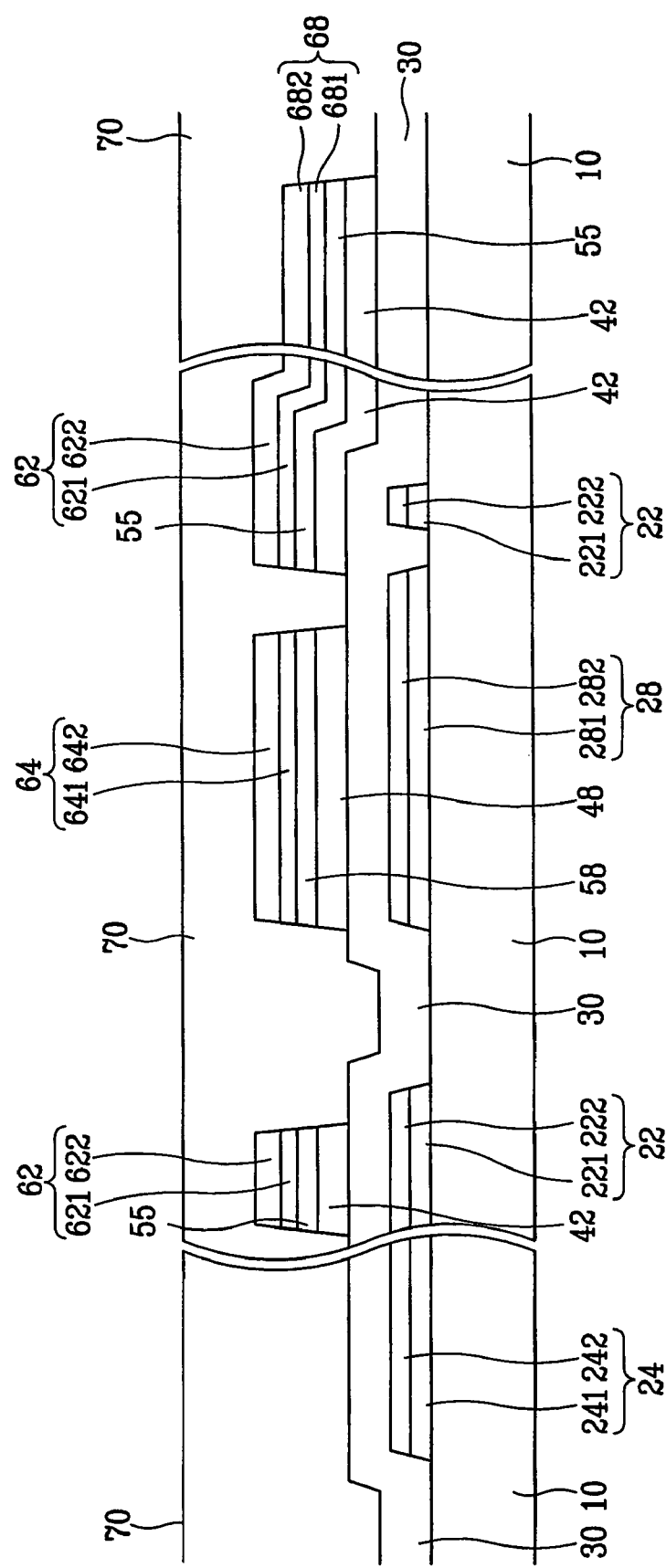

Next, a protection film 70 is formed by growing a silicon nitride film, an a-Si:C:O film or an a-Si:O:F film by the chemical vapor deposition (CVD) method, or by applying an organic insulation film, as in FIGS. 19a and 19b.

Figure 20A:
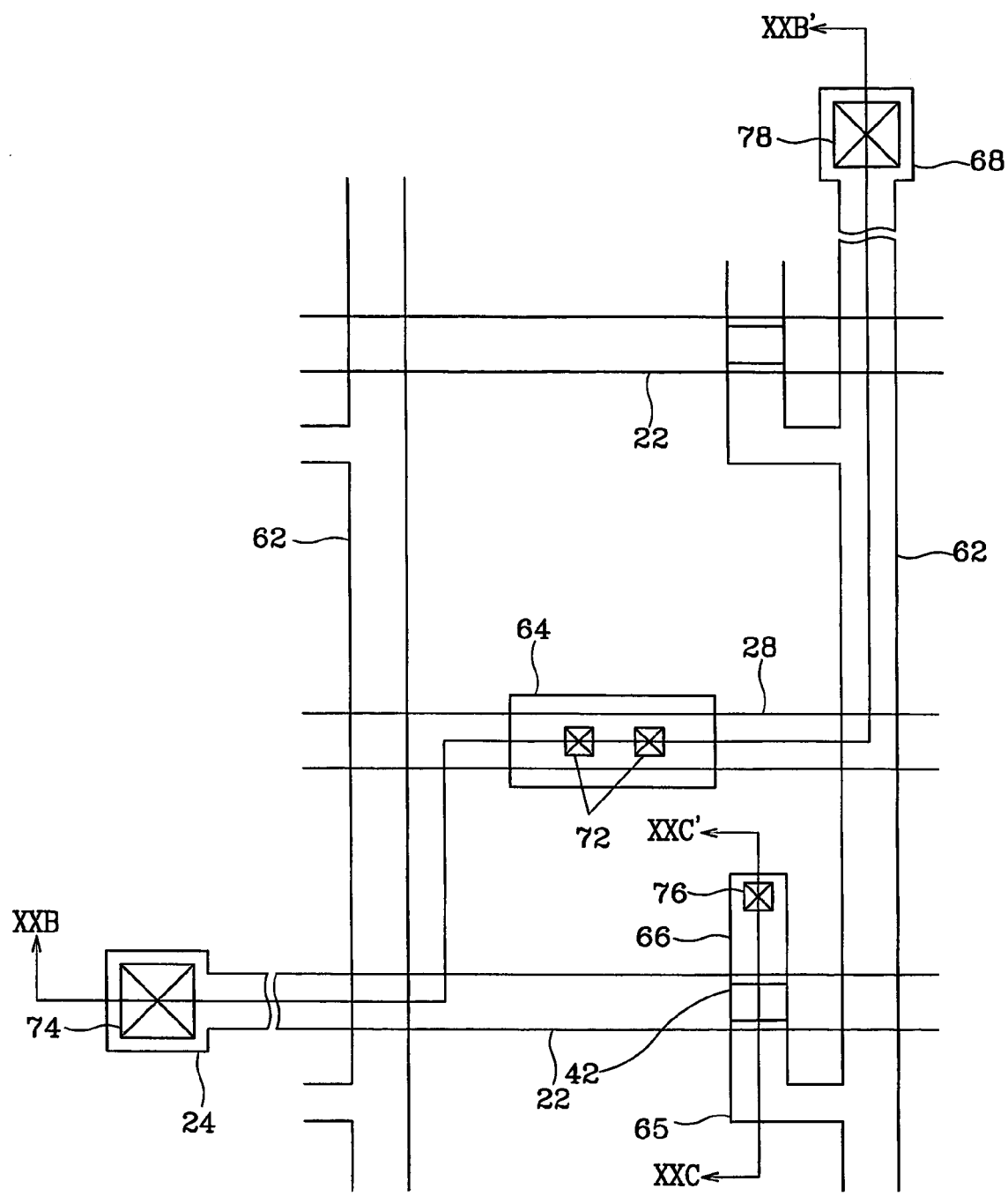
FIG. 20*a* is a diagrammatic view of a thin film transistor substrate at the step next to that of FIG. 19*a* and FIG. 19*b*.
Figure 20B:
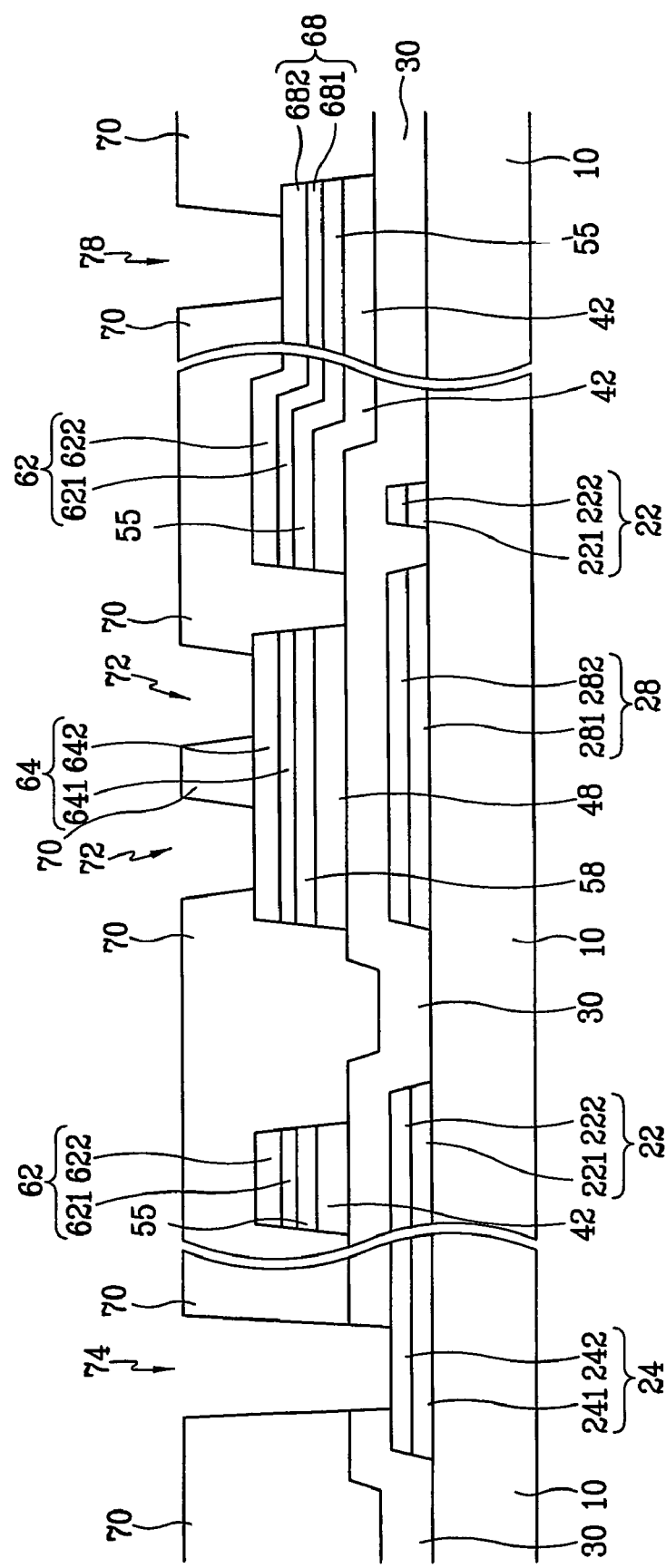
FIGS. 20*b* and 20*c* are cross-sectional views along the lines XXb–XXb' and XXc–XXc' of FIG. 20*a*, respectively.
Figure 20C:
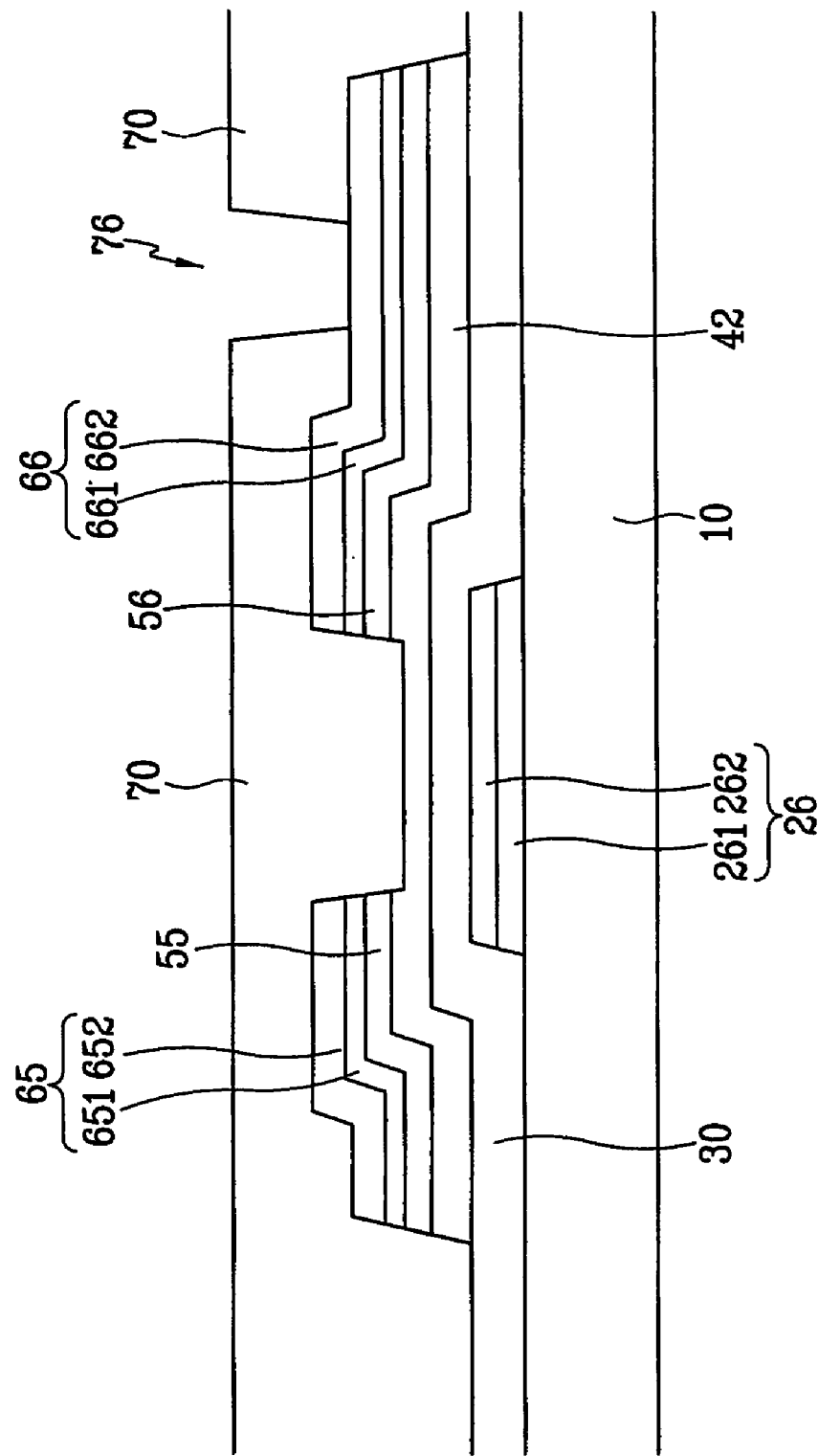

Then, the protection film 70 is photo-etched along with the gate insulation film 30 to form contact openings 76, 74, 78, 72 that expose the drain electrode 66, the end part of the gate line 24, the end part of the data line 68 and the conductor pattern for maintenance capacitor 64, respectively, as in FIGS. 20a to 20c. Preferably, areas of the contact openings 74, 78 that expose the end parts 24, 68 range from 0.5 mm×15 μm to 2 mm×6 μm.

Lastly, an ITO film or an IZO film is deposited to 400 Å to 500 Å of thickness and photo-etched to form a pixel electrode 82 connected with the drain electrode 66 and the conductor pattern for maintenance capacitor 64 and a contact supporting member 88 connected with the end part of the gate line 24, the contact supporting member 86 and the end part of the data line 68, as in FIGS. 11 to 13.

Preferably, nitrogen gas is in the pre-heating process before depositing ITO or IZO to prevent formation of metal oxidation film on the metal film 24, 64, 66, 68 exposed through the contact openings 72, 74, 76, 78).

The second example of the present invention simplifies manufacture processes by forming the data wiring 62, 64, 65, 66, 68, the contact layer pattern 55, 56, 58 below it and the semiconductor pattern 42, 48 using one mask and separating the source electrode 65 from the drain electrode 66, while offering the advantage of the first example of the present invention.

While the second example of the present invention also forms both the gate wiring and the data wiring in two layers, only one of the gate wiring or the data wiring may be formed in two layers, if necessary.

Since a thin film transistor substrate of the present invention comprises self-assembled monolayers between the substrate and the metal wiring, it has a good adhesion ability to the substrate and effectively prevents diffusion of the metal wiring material to the substrate.

What is claimed is:

1. A thin film transistor substrate comprising self-assembled monolayers between the substrate and a metal wiring, the self-assembled monolayers being formed by the compounds selected from a group consisting of 3-aminopropyltrimethoxysilane, 3-aminopropyltriethoxysilane, 2-aminoundecyltrimethoxysilane, aminophenyltrimethoxysilane, N-(2-aminoethylaminopropyl)trimethoxysilane, methyltrimethoxysilane, propyltriacetoxysilane, (3-mercaptopropyl)trimethoxysilane and (3-mercaptopropyl)trimethoxysilane.

2. A thin film transistor substrate according to claim 1, wherein thickness of the self-assembled monolayers ranges from 2 to 3 nm.

3. A thin film transistor substrate according to claim 1, wherein the metal wiring is made of copper or alloy of copper and metals selected from a group consisting of Ag, Mg, B, Ca, Al, Li, Np, Pu, Ce, Eu, Pr, La, Nd, Sm and Zn.

4. A thin film transistor substrate according to claim 1, wherein the substrate is a glass substrate, an n+a-Si/a-Si/SiN three-layer substrate, or an Si, $SiO_2$ or other low-k (k<3.5) substrate.

5. A thin film transistor substrate comprising:
an insulation substrate;
a first signal line formed on the insulation substrate;
a first insulation film formed on the first signal line;
a second signal line formed on the first insulation film and crossing the first signal line;
a thin film transistor electrically connected with the first signal line and the second signal line;
a second insulation film formed on the thin film transistor and having a first contact opening that expose an electrode of the thin film transistor; and
a pixel electrode formed on the second insulation film and connected to an electrode of the thin film transistor through the first contact opening, wherein at least one of the first signal line and the second signal line has a copper or copper alloy wiring structure consisting of a double layer of self-assembled monolayers and a Cu layer.

6. A thin film transistor substrate according to claim 5, wherein at least one of the first signal line and the second signal line has a copper or copper alloy wiring structure consisting of three layers of self-assembled monolayers, an Ag layer and a Cu layer.

7. A thin film transistor substrate comprising:
a gate wiring formed on an insulation substrate and comprising a gate line and a gate electrode connected to the gate line;
a gate insulation film covering the gate wiring;
a semiconductor pattern formed on the gate insulation film;
a data wiring comprising a source electrode and a drain electrode formed in the same layer on the gate insulation film or on the semiconductor pattern, which are separated from each other, and a data line connected to the source electrode and crossing the gate line to define a pixel area; a protection film having a first contact opening that exposes the drain electrode; and
a pixel electrode formed on the protection film and connected with the drain electrode through the first contact opening, wherein at least one of the gate wiring and the data wiring has a copper or copper alloy wiring structure consisting of a double layer of self-assembled monolayers and a Cu layer.

8. A thin film transistor substrate comprising:
an insulation substrate;
a gate wiring formed on the substrate and comprising a gate line, a gate electrode and an end part of the gate line;
a gate insulation film formed on the gate wiring and having a contact opening that exposes the end part of the gate line;
a semiconductor pattern formed on the gate insulation film;
a data wiring comprising a source electrode, a drain electrode, a data line and an end part of the data line that has a contact layer pattern on the gate insulation film or on the semiconductor pattern;
a protection film formed on the data wiring and having contact openings that expose the end part of the gate line, the end part of the data line and the drain electrode; and
a transparent electrode layer pattern electrically connected with the exposed end part of the gate line, end part of the data line and drain electrode, wherein at least one of the gate wiring and the data wiring has a copper or copper alloy wiring structure consisting of a double layer of self-assembled monolayers and a Cu layer.

9. A thin film transistor substrate according to claim 7 or claim 8, which further comprise an ohmic contact layer formed between the semiconductor pattern and the data wiring, wherein the ohmic contact layer has a structure substantially identical to that of the data wiring.

10. A thin film transistor substrate according to claim 7 or claim 8, wherein the semiconductor pattern is substantially the same pattern as that of the data wiring except the data wiring crosses the gate wiring.

11. A metal wiring method of a thin film transistor substrate comprising:
a step of coating a coating composition for self-assembled mono layers (SAMs) formation on a substrate and heat-treating it;
a step of depositing a metal wiring material on the substrate; and
a step of heat-treating the substrate, wherein the coating composition for self-assembled monolyaers formation comprises the compounds selected from a group consisting of 3-aminopropyltrimethoxysilane, 3-aminopropyltriethoxysilane, 2-aminoundecyltrimethoxysilane, aminophenyltrimethoxysilane, N-(2-aminoethylaminopropyl)trimethoxysilane, methyltrimethoxysilane, propyltriacetoxysilane, (3-mercaptopropyl)trimethoxysilane and (3-mercaptopropyl)trimethoxysilane.

12. A copper wiring method of a thin film transistor substrate according to claim 11, wherein the substrate is a glass substrate, an n+a-Si/a-Si/SiN three-layer substrate, or an Si, $SiO_2$ or other low-k (k<3.5) substrate.

* * * * *